(12) United States Patent
Johnston et al.

(10) Patent No.: US 6,369,603 B1
(45) Date of Patent: Apr. 9, 2002

(54) RADIO FREQUENCY COUPLING APPARATUS AND METHOD FOR MEASURING MINORITY CARRIER LIFETIMES IN SEMICONDUCTOR MATERIALS

(75) Inventors: Steven W. Johnston, Golden; Richard K. Ahrenkiel, Lakewood, both of CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/615,960

(22) Filed: Jul. 14, 2000

Related U.S. Application Data

(63) Continuation-in-part of application No. 09/283,738, filed on Apr. 1, 1999, now Pat. No. 6,275,060, which is a continuation-in-part of application No. 08/922,003, filed on Sep. 2, 1997, now Pat. No. 5,929,652.

(51) Int. Cl.$^7$ .............................................. G01R 31/26
(52) U.S. Cl. ...................................... 324/766; 324/750
(58) Field of Search ................................ 324/766, 765, 324/767, 750, 752, 753

(56) References Cited

U.S. PATENT DOCUMENTS

| | | | | |
|---|---|---|---|---|
| 3,939,415 A | * | 2/1976 | Terasawa | 324/767 |
| 4,949,034 A | * | 8/1990 | Imura et al. | 324/765 |
| 5,047,713 A | * | 9/1991 | Kirino et al. | 324/767 |
| 5,081,414 A | * | 1/1992 | Kusama et al. | 324/767 |
| 5,406,214 A | * | 4/1995 | Boda et al. | 324/765 |
| 5,451,886 A | * | 9/1995 | Ogita et al. | 324/767 |
| 5,477,158 A | * | 12/1995 | Shafer et al. | 324/753 |
| 5,760,597 A | * | 6/1998 | Yoshida et al. | 324/765 |

* cited by examiner

Primary Examiner—Ernest Karlsen
(74) Attorney, Agent, or Firm—Paul J. White

(57) ABSTRACT

An apparatus for measuring the minority carrier lifetime of a semiconductor sample using radio-frequency coupling. The measuring apparatus includes an antenna that is positioned a coupling distance from a semiconductor sample which is exposed to light pulses from a laser during sampling operations. A signal generator is included to generate high frequency, such as 900 MHz or higher, sinusoidal waveform signals that are split into a reference signal and a sample signal. The sample signal is transmitted into a sample branch circuit where it passes through a tuning capacitor and a coaxial cable prior to reaching the antenna. The antenna is radio-frequency coupled with the adjacent sample and transmits the sample signal, or electromagnetic radiation corresponding to the sample signal, to the sample and receives reflected power or a sample-coupled-photoconductivity signal back. To lower impedance and speed system response, the impedance is controlled by limiting impedance in the coaxial cable and the antenna reactance. In one embodiment, the antenna is a waveguide/aperture hybrid antenna having a central transmission line and an adjacent ground flange. The sample-coupled-photoconductivity signal is then transmitted to a mixer which also receives the reference signal. To enhance the sensitivity of the measuring apparatus, the mixer is operated to phase match the reference signal and the sample-coupled-photoconductivity signal.

19 Claims, 18 Drawing Sheets

RADIO FREQUENCY COUPLING APPARATUS AND METHOD FOR MEASURING MINORITY CARRIER LIFETIMES IN SEMICONDUCTOR MATERIALS

CROSS REFERENCE TO RELATED PATENT APPLICATION

This patent application is a continuation-in-part of co-pending U.S. patent application Ser. No. 09/283,738, filed with the U.S. Patent and Trademark Office on Apr. 1, 1999, now U.S. Pat. No. 6,275,060, which is a continuation-in-part of U.S. patent application Ser. No. 08/922,003, filed with the U.S. Patent and Trademark Office on Sept. 2, 1997, now U.S. Pat. No. 5,929,652.

CONTRACTUAL ORIGIN OF THE INVENTION

The United States Government has rights in this invention under Contract No. DE-AC36-99GO10337 between the U.S. Department of Energy and the National Renewable Energy Laboratory, a Division of Midwest Research Institute.

BACKGROUND OF THE INVENTION

1. Field of the Invention

This invention relates to the field of semiconductors and, more specifically, to a method and apparatus for measuring minority carrier recombination lifetimes of semiconductor materials using radio frequency coupling techniques.

2. Description of the Prior Art

Semiconductors are a group of solid materials that are intermediate between conductors, which conduct electricity, and insulators, which do not conduct electricity. Semiconductors may be comprised of single elements or compounds of multiple elements. Silicon and germanium are well known examples of elemental semiconductor materials while indium phosphide and gallium arsenide are examples of compound semiconductors.

Electrons in outer shells of atoms in conductive materials, such as metals, are not bound to specific atoms and float freely from atom to atom, so such materials conduct electricity readily, whereas electrons in outer shells of atoms in insulator materials are tightly bound to their respective atoms so that they do not conduct electric current. The ability of a piece of semiconductor material to conduct electricity is a result of the semiconductor having negatively charged electrons and vacant electron energy states—electron "holes"—that behave as though they are positively charged particles near the top of an energy band. Quantum states occupied by electrons can create charge carriers with negative charges that behave as negatively charged free particles. The positively charged holes are quantum energy states in the semiconductor material with an absence of the negatively charged free particles or electrons. When an electron and a hole combine, the net charge is zero. When an electric voltage is applied across a piece of semiconductor material, a positive end of the semiconductor and a negative end of the semiconductor material are established. The externally applied electric voltage causes electrons to travel between the atoms in the semiconductor material from the negative end of the semiconductor material to the positive end of the semiconductor material, while the "holes" travel conversely in the opposite direction. The electrons and holes are referred to as charge carriers because they provide the means of charge flow, or electric current. When a voltage is applied across a piece of semiconductor material, electrons drift toward the positive end of the semiconductor and the holes drift toward the negative end of the semiconductor material The flow of electric current in a semiconductor can be described as motion by both electrons and holes. The semiconductor material may be "doped" by the addition of a chemical impurity to increase the number of holes or electrons. The impurities producing electrons are called donors and the impurities producing holes are called acceptors. When chemical doping is performed, the generated particle, electron or hole, is called the majority carrier. The less populous particle is called the minority carrier.

When a sample of semiconductor material is in equilibrium, no external forces such as electric voltages, electric fields, magnetic fields, or temperature gradients are acting on the semiconductor material. When in an equilibrium condition, the semiconductor material is electrically neutral with the net positive charge equal to the net negative charge. Electrons are continually being excited by heat, light, or other energy during equilibrium, however, such that free electrons from lower energy bands are excited to higher energy conductor bands where they move randomly in the semiconductor material. This "generation" of electrons for the semiconductor bands also generates a concomitant hole for each generated electron. Simultaneously, an electron moving randomly through the semiconductor material may come into close proximity to a hole and recombine with the hole. Since the net concentrations of holes and electrons in a sample of semiconductor material at equilibrium remain constant, the rate at which electron and hole pairs are generated and the rate at which they recombine must be equal.

Any deviation from equilibrium will change the electron and hole concentrations in a semiconductor to new levels. The deviation from equilibrium can be created by, for example, applying an electric voltage across the semiconductor, directing light onto the semiconductor, or increasing the temperature of the semiconductor, which will increase the concentrations or densities of excess electrons and holes in the semiconductor, or by creating new electron-hole pairs at a rate equal to the recombination rate. The excess charge carriers generated by such energy input create additional electric current flowing through the semiconductor, while deletion of charge carriers by recombination inhibits electric current flow.

When sufficient energy from an external source or stimulus is applied to the semiconductor material to increase the generation of electrons and holes to a rate that is greater than the rate of recombination of electrons and holes, the population or density of electrons and holes increases until the semiconductor material reaches a new equilibrium point. The electric current carrying capacity of the semiconductor material is proportional to the densities of the electrons and holes. Therefore, increasing the densities of electrons and holes in the semiconductor material in the presence of a voltage will increase the electric current flowing in the semiconductor material.

After removal of the external energy source or stimulus from the semiconductor material, the rate of recombination of electrons and holes will be greater than the rate of generation of electrons and holes until equilibrium in the semiconductor material is reached. However, the semiconductor's return to its equilibrium condition will not be instantaneous. Rather, a period of time will elapse while recombination of electrons and holes occurs before the semiconductor material reaches its original equilibrium condition. During this period of time after the external energy source or stimulus to the semiconductor material has been removed and before the semiconductor material has returned to its equilibrium condition, the excess charge carriers allow the semiconductor material to continue to conduct electricity. Thus, the longer the time period it takes a semiconductor material to return to its equilibrium condition after the externally applied energy source or stimulus is removed, the longer the semiconductor material will conduct electricity after the externally applied energy source or stimulus is removed. This important characteristic of a semiconductor is known as the semiconductor's recombination rate or minority carrier lifetime.

Many prior art devices exist to measure a semiconductor material's minority carrier lifetime. For example, U.S. Pat. No. 5,453,703 issued to Goldfarb and U.S. Pat. No. 5,406,214 issued to Boda et al., each disclose a method or apparatus for measuring minority carrier lifetimes of semiconductor materials. Goldfarb uses a capacitance-coupling technique to measure minority-carrier recombination velocity on the surface of semiconductor materials. Unfortunately, Goldfarb's disclosed method is not suitable for testing an entire sample of semiconductor material (i.e., a bulk sample). Boda et al. measure the microwave energy reflected from holes and electrons in the specimen under test to determine minority carrier lifetimes in semiconductors. Unfortunately, the use of reflected microwaves to measure minority carrier lifetimes creates inherent limitations, such as being limited to high resistivity samples that prevent the lifetime measurement for highly conducting materials, that limit the use of the disclosed method and apparatus. Other prior art devices and methods suffer from the problem that the output of system is not reliably linear. Therefore, these prior art devices were not consistently accurate when testing samples of different shapes, sizes, and properties. Furthermore, these prior art devices did not always display a high sensitivity. Therefore, they could not always produce a measurable output signal from which the minority carrier lifetime of the sample being tested could be determined. Thus, despite the state of the art, there remains a need for a nondestructive, contact free system for accurately measuring minority carrier lifetimes in semiconductor materials that possesses both linearity and sensitivity.

Further, the previously known devices and methods for measuring minority carrier lifetimes ("$\tau$") were only capable of measuring minority carrier lifetimes in semiconductor materials having specific energy bandgaps, in direct or indirect bandgap semiconductor materials (i.e., typically not being able to measure both types of bandgap materials), and in semiconductor materials having a certain range of minority carrier lifetime values, i.e., generally relatively long lifetime values, e.g., at least about 40 nanoseconds, or relatively short, e.g., less than about 2 nanoseconds. For example, the presently practiced time-resolve photoluminescence ("TRPL") method of measuring minority carrier lifetimes is only useful for measuring minority carrier lifetimes in direct bandgap semiconductors that have a bandgap greater than about 1.1 electronvolts (eV), which limits TRPL's usefulness to a limited number of semiconductors that fit these criteria. Another known measurement method known as up-conversion TRPL is relatively effective for smaller bandgap semiconductor materials but only when the minority carrier lifetimes are very short, i.e., $\tau$ less than about 2 nanoseconds. Significantly, none of the known measuring devices provides a means for directly measuring minority carrier lifetimes in the range of about 2 to about 40 nanoseconds. Consequently, there remains a need for a single method and apparatus that is capable of measuring minority lifetimes in all types of semiconductor materials, i.e., in both direct bandgap materials and indirect bandgap materials which include silicon and germanium semiconductor materials, in semiconductors with a wide range of bandgap values (including materials with small bandgaps of less than 1.1 eV, such as GaAsN with between about 3 to 5 percent N, InAs, certain InGaAs alloys, InSb, and GaSb), and in semiconductors having relatively short minority carrier lifetimes, such as less than about 40 nanoseconds.

In addition to the disclosure of parent U.S. Pat. No. 5,929,652 referenced above, the inventors determined as discussed in the continuation-in-part application No. 09/283,738 and via additional analysis and empirical testing that additional variables and considerations must be taken into account to fully and accurately explain the linearity and sensitivity achieved by the disclosed apparatus. More specifically, in the parent U.S. Pat. No. 5,929,652 referenced above, the applicant had not recognized that the coil functions as an antenna in the disclosed apparatus, thereby creating a radiation resistance that alters and adds to the electrical impedance characteristics of the apparatus, particularly since the operation of the coil as an antenna may create a coupled impedance between the coil and the sample. Thus, the apparatus disclosed in the parent patent functions in a more complex manner than was originally believed, thereby potentially negating partially or completely the electrical circuit model discussed in the parent patent.

SUMMARY OF THE INVENTION

Accordingly, it is a general object of the present invention to provide apparatus and methods for measuring the minority carrier lifetimes and excess carrier recombination rates of semiconductor materials.

It is another general object of the present invention to provide apparatus and methods for accurately measuring minority carrier lifetimes and excess carrier recombination rates of semiconductor materials.

It is another object of the present invention to provide apparatus and methods for measuring minority carrier lifetimes and excess carrier recombination rates of semiconductor materials with consistent high sensitivity.

It is still another object of the present invention to provide apparatus and methods for measuring the minority carrier lifetimes and excess carrier recombination rates of semiconductor materials with consistent, accurate results for materials of different sizes, shapes, and other material properties.

It is a related object of the present invention to provide an apparatus and method for measuring the minority carrier lifetimes of both direct and indirect bandgap semiconductor materials.

It is another related object of the present invention to provide an apparatus and method for measuring the minority carrier lifetimes of semiconductor materials having a relatively short minority carrier lifetime and/or having a relatively small bandgap.

It is yet another object of the present invention to provide apparatus and methods for the contactless measurement of minority carrier lifetimes and excess carrier recombination rates of semiconductor materials.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, an apparatus in accordance with the present invention includes a coil capable of generating electromagnetic radiation when an electric current flows through the coil; a positioner capable of positioning the sample in proximity to the coil; a light source; a bridge circuit having four nodes connected by four branches, three of said four branches including resistive elements and the remaining branch including a capacitive element in electrical parallel with a connection to the coil; and an oscillator connected to two of the nodes of said bridge circuit such that the oscillator can apply a voltage signal to the two nodes of the bridge circuit.

To further achieve the foregoing and other objects and in accordance with the purposes of the present invention, as embodied and broadly described herein, a method in accordance with the present invention for determining carrier lifetime or recombination rate of a semiconductor sample includes applying an input voltage signal having a frequency to two nodes of a bridge circuit having four branches, wherein three branches of the bridge circuit include resistive elements and a fourth branch of the bridge circuit includes a primary capacitive element in parallel with a connection to a coil capable of generating electromagnetic radiation when an electric current flows through the coil; positioning the sample in proximity to the coil; balancing the bridge circuit by adjusting position of the sample relative to the coil; illuminating the sample for a finite period of time; and measuring an output voltage signal at two nodes of the bridge circuit which are different from the two nodes of the bridge circuit to which the input voltage signal is applied.

Also to achieve the foregoing and other objects and in accordance with the purposes of the present invention, as embodied and broadly described herein, a method in accordance with the present invention for measuring carrier lifetime or recombination rate of a semiconductor material sample, includes applying an input voltage signal having a frequency to two nodes of a bridge circuit having four branches, wherein three branches of the bridge circuit include resistive elements and a fourth branch of the bridge circuit includes a capacitive element in parallel with a connection to a coil; conducting an electric current through the coil; positioning the semiconductor material in proximity to the coil; calibrating the frequency of the input voltage signal; balancing the bridge circuit by adjusting mutual inductance and/or coupled impedance between sample semiconductor material and the coil; illuminating the semiconductor material for a finite period of time; and measuring an output voltage signal at two nodes of the bridge circuit which are different from the two nodes of the bridge circuit to which said input voltage signal is applied.

Also to achieve the foregoing and other objects and in accordance with the purposes of the present invention, as embodied and broadly described herein, an apparatus in accordance with the present invention includes a bridge circuit having four nodes connected by four branches, three of which branches have resistive components and a fourth of which branches has a capacitive component; a coil capable of generating electromagnetic radiation when electric current flows through the coil positioned at a distance spaced apart from the semiconductor material in an adjustable manner such that the distance is variable, the coil being connected electrically to the fourth branch of the bridge circuit in parallel with the capacitance component; an oscillator connected to two of the nodes of the bridge circuit in such a manner that the oscillator imparts a voltage signal across the two nodes; a light source positioned to illuminate the semiconductor material with a pulse of light; and a voltage detector connected electrically across two of the nodes of the bridge circuit that are not the same nodes to which the oscillator is connected.

Also to achieve the foregoing and other objects and in accordance with the purposes of the present invention, as embodied and broadly described herein, a method in accordance with the present invention for determining carrier lifetime of a sample of semiconductor material includes providing a circuit capable of creating an output signal indicative of the sample's conductivity when the sample is illuminated and of eliminating any portion of the output signal that is indicative of the sample's dark conductivity; electromagnetically coupling the circuit and the sample; adjusting mutual inductance and/or coupled impedance between the sample and the circuit such that the output signal is eliminated; illuminating the sample for a finite period of time; and measuring the output signal.

To further achieve the above and other objectives, an alternative measuring apparatus is provided that is configured with components to provide higher efficiency radio-frequency coupling between a semiconductor sample and an included antenna and to provide reduced system response times. These aspects of the measuring apparatus enable the measuring apparatus to measure minority carrier lifetimes in semiconductor samples having a short lifetime (i.e., less than about 40 nanoseconds), having any sized bandgap (including less than about 1.1 eV), and/or measuring minority carrier lifetimes in both direct and indirect bandgap materials. To increase radio-coupling efficiency, the measuring apparatus includes a signal generator that is adapted to operate at high frequencies, such as about 400 MHz and more preferably, above about 900 MHz. The signal generator transmits a sinusoidal waveform signal that is split by the measuring apparatus into a reference signal and a sample signal. The sample signal is transmitted by a high frequency, low reactance antenna to a coupled semiconductor sample which reflects varying intensity sample-coupled-photoconductivity signals back to the antenna in response to light pulses striking the sample from a laser. The measuring apparatus uses measured changes in the sample-coupled-photoconductivity signal intensity or power to determine the minority carrier lifetime of the sample.

According to an important feature of the measuring apparatus, the sample signal enters a sample branch circuit in which impedance is matched to improve system response, i.e., to reduce the time for power to flow through the included components, thereby allowing the measuring apparatus to measure minority carrier lifetimes in the 2 to 40 nanosecond range which previously had not been successfully accomplished. As an example of impedance "matching," in a 50 ohm system, an antenna having 50 ohm real resistance would have optimal transient response. As may be understood by those skilled in the art, large antenna reactance and small resistance provides a large quality factor, Q, which results in good signal sensitivity but longer transient times. Conversely, reducing antenna reactance may lower the quality factor, Q, but provides faster transient times and faster system response. In this regard, higher operating frequencies provides room for increased bandwidth, which is necessary to resolve shorter transients corresponding with faster system response. With these effects in mind and to lower impedance, the antenna used to transmit the sample signal to the sample and to receive the reflected power from the sample (i.e., the sample-coupled-photoconductivity signal) is preferably selected to have a relatively low antenna reactance, as well as being operable at higher operating frequency. In one preferred embodiment, the antenna is a hybrid waveguide/aperture antenna with a centrally positioned transmission line and a ground flange adjacent the transmission line. The antenna is selectively positioned, with a positioner or other device, a coupling distance from the sample. To further control or lower impedance, a cable with a relatively short length, i.e., preferably less than 1 wavelength and more preferably less than about ¼ wavelength, is used to transmit the sample signal from a tuning capacitor or other matching element to the antenna. In other embodiments, the antenna and coupled sample is impedance-matched to the system (for example, 50 ohms) by using lumped reactive element (e.g., a capacitor) matching, series or shunt transmission line stub matching, or quarter-wave transformer matching. Additionally, in the sample branch circuit, shorter interconnecting cables are used to reduce loss and increase signal sensitivity, but preferably are a certain, known fraction of the sample signal wavelength for furthering impedance matching.

According to another important feature of the measuring apparatus, the reference signal and the signal in the sample branch circuit, i.e., the sample-coupled-photoconductivity signal, are phase matched which acts to operatively link the signal generator and the signal detection portion of the measuring apparatus, i.e., the antenna, the tuning capacitor, and other components. Phase matching of these signals enables the measuring apparatus to measure very small changes in the reflected power or sample-coupled-photoconductivity signal, thereby significantly enhancing the sensitivity of the measuring apparatus in measuring minority carrier lifetimes. Phase matching can be accomplished in several ways, including operating a phase shifter included in the reference signal branch of the measuring apparatus and operating a mixer used to receive the reference signal and the sample-coupled-photoconductivity signal so as to maximize the output signal from the mixer.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE PREFERRED EMBODIMENTS

Figure 1:
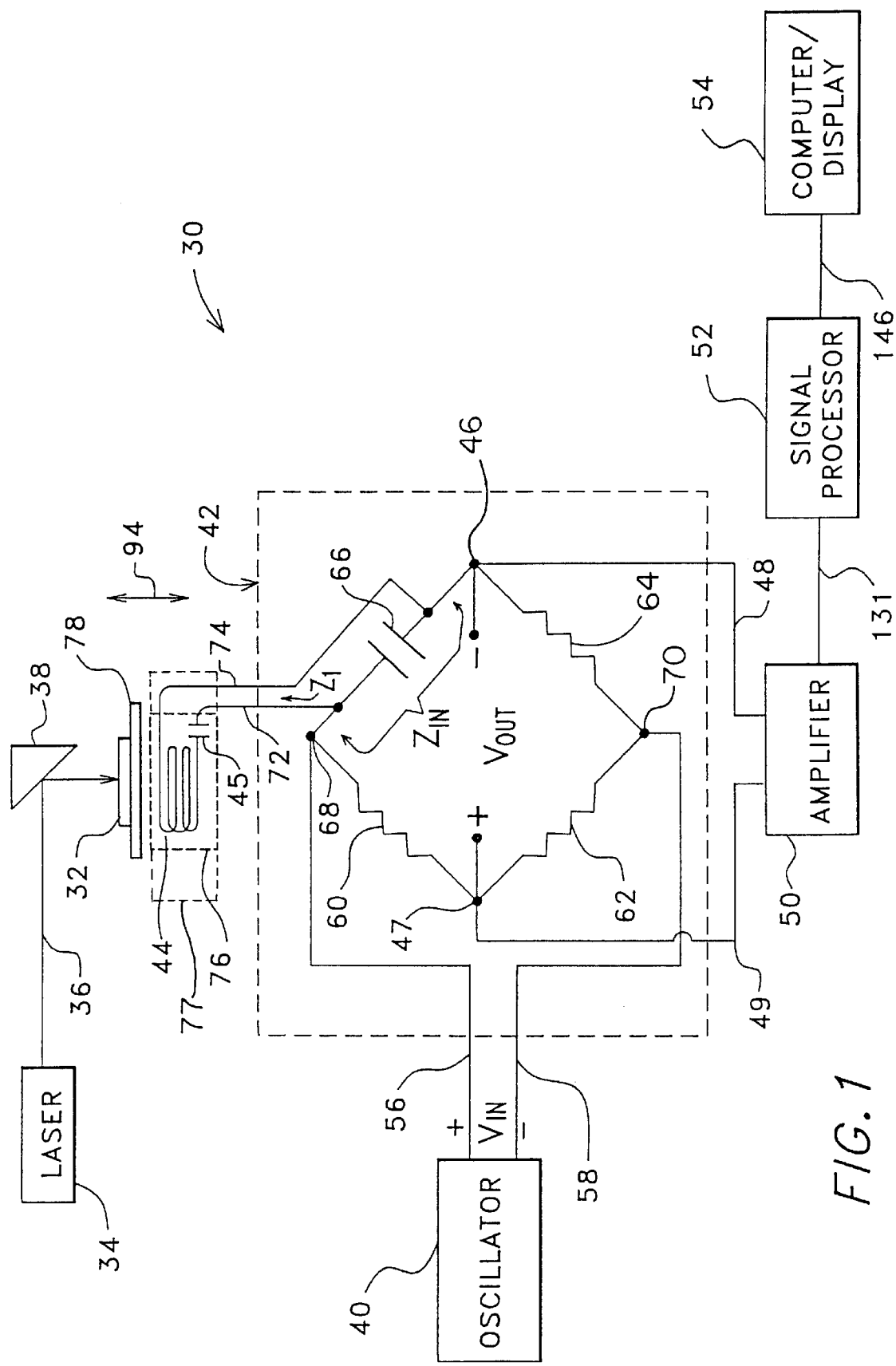
FIG. 1 is a diagrammatic representation of the semiconductor photoconductive decay measuring apparatus of the present invention.

The semiconductor photoconductive decay measuring apparatus 30 for measuring minority carrier lifetime of a semiconductor sample 32 is illustrated schematically in FIG. 1 and includes a laser or other light source 34 for creating and directing a light beam 36 to illuminate the semiconductor sample 32 after the light beam 36 is deflected by a prism mirror, or other deflector 38. The light source 34 may also be positioned such that it directs the beam 36 directly onto the sample 32. An oscillator 40 connected to a bridge circuit 42 generates an electric current in a coil 44, which is positioned adjacent the semiconductor sample 32, for electromagnetically coupling the semiconductor sample 32 and the coil 44.

When the laser or other light source 34 illuminates the semiconductor sample 32 with a pulse of light, the sample 32 will generate excess electrons and holes, thereby altering the photoconductance $G_L$ of the sample 32 and, as a result, also altering the electrical impedance characteristics of the bridge circuit 42. As will be discussed in more detail below, a capacitor 45 is preferably connected in parallel with the coil 44. In addition, when electric current flows through the coil 44, the coil 44 functions as an antenna that produces high frequency electromagnetic waves, thereby creating a radiation resistance or impedance that also alters the electrical impedance characteristics of the apparatus 30, as will be discussed in more detail below. Electromagnetic radiation from the coil 44 creates power losses for the system 30, which result in the radiation resistance or impedance. The radiation resistance or impedance of an antenna is the value of a hypothetical resistance or impedance that would dissipate an amount of power equal to the radiated power when the current in the resistance or impedance is equal to the maximum current along the antenna. The radiation resistance ($R_r$) of a small coil or loop is generally given by the following formula: $R_r = \zeta \beta^4 (NA)^2 / 6\pi$ where $\zeta$ is the wave impedance of free space (approximately 377 ohms), $\beta$ is the propagation constant of the electromagnetic waves in free space, N is the number of turns in the coil, and A is the area of each loop in the coil. As a result of the coil 44 functioning as or like an antenna, a coupled impedance may be created between the coil 44 and the sample 32.

When the pulse illumination of the sample 32 by the laser or other light source 34 ends or terminates, the observed recombination of excess electrons and holes in the sample 32 will begin to be recorded by the measurement apparatus 30. As a result of such recombination, the electrical impedance characteristics of the bridge circuit 42 will change such that a measurable voltage signal $V_{OUT}$ indicative of the excess carrier density of the semiconductor sample 32 can be detected and measured between the nodes 46, 47 of the bridge circuit. The excess electrons and holes in the semiconductor sample 32 recombine and the sample 32 returns to an equilibrium state. The logarithmic derivation of the signal $V_{OUT}$ with respect to time is defamed as the minority carrier lifetime. The apparatus 30 is preferably enclosed in a chamber or other enclosure or room, or is otherwise configured, such that the only illumination of the sample 32 is created by the light source 34.

The nodes 46, 47 are connected to the leads 48, 49, respectively, which are connected to an amplifier 50 to amplify the detected high frequency voltage $V_{OUT}$ of the bridge circuit 42. A signal processor 52 removes the unwanted portion of the amplified voltage signal $V_{OUT}$ created by the amplifier 50, and a computer/display device 54 displays or stores the measured signal from the signal processor 52. The voltage signal displayed on the computer/display device 54 is indicative of the minority carrier lifetime or recombination rates of the semiconductor sample 32, as will be discussed in more detail below. The sample's 32 minority carrier lifetime or recombination characteristics may vary over time and may be different for different portions of the sample 32. Furthermore, many different methods and algorithms can be used to determine the different characteristics from the portion of the voltage signal $V_{OUT}$ indicative of the characteristics generated from the voltage signal $V_{OUT}$.

A significant advantage of the measuring apparatus 30 of this invention is that the apparatus 30 provides for the contactless measurement of the minority carrier lifetime or recombination rates of semiconductor samples and provides consistently accurate results for semiconductor samples of different shapes, sizes, and properties, including samples that have not been measurable by prior art systems, as will also be discussed in more detail below. In order to obtain such consistently accurate results, the apparatus 30 has linearity over two or more decades of excess carrier density and has improved sensitivity. With linearity, the change in the electrical impedance characteristics of the apparatus 30 will be linearly related to the pulse of illumination from the laser 34. More specifically, the sample 32 is positioned in the apparatus 30 such that the input impedance $Z_{IN}$ prior to illumination of the sample 32 remains approximately constant for samples of different sizes, shapes, and material properties, and such that the change in the input impedance $Z_{IN}$ after illumination of the sample 32 is linearly related to the change in photoconductance $G_L$ of sample 32, as will be discussed in more detail below. With sensitivity, the apparatus 30 generates a measurable voltage signal $V_{OUT}$ for semiconductor samples having many different sizes, shapes, and material properties.

The oscillator 40 generates a high frequency electric voltage signal $V_{IN}$ on the leads or terminals 56, 58 that has an oscillator frequency $f_o$ that is preferably constant during testing of samples and typically in a range between 400 megahertz (MHz) and 460 megahertz (MHz). Optimally, the oscillator 40 generates an oscillator frequency $f_o$ that is approximately 420–430 megahertz. The peak-to-peak amplitude of the voltage signal $V_{IN}$ is approximately ten volts. The oscillator 40 supplies the voltage signal $V_{IN}$ to the bridge circuit 42 at the nodes 68, 70. The bridge circuit 42 includes the resistors 60, 62, 64 and the capacitor 66. The resistors 60, 62, 64 preferably have equal values and can be, for example, fifty ohms or two-hundred ohms each. The capacitor 66 preferably has a value of approximately twenty picofarads but can be set to many different values. The input terminals 56, 58 are connected to the nodes 68, 70, respectively, of the bridge circuit 42. The bridge circuit 42 includes an electrical connection to the coil 44 with the leads 72, 74 such that the coil 44 forms part of the bridge circuit 42. The leads or terminals 72, 74 may actually constitute a coaxial cable or line so as to ensure that the impedance $Z_1$ is equal to the inductive reactance of the coil 44. The capacitor 66 is configured in parallel with the coil 44 and the capacitor 45 ($C_B$).

As previously discussed above, it is an important feature of the system 30 that the coil 44 functions as an antenna when electric current is flowing through the coil 44, thereby providing radio frequency coupling with the sample 32 rather than inductive coupling. The coil 44 generates electromagnetic waves and creates a radiation resistance that affects the electrical impedance characteristics of the apparatus 30. The coil 44 in one embodiment is a three turn coil made of eighteen gauge (18 AWG) wire. In addition, the coil 44 preferably has an outer diameter of approximately five millimeters, a depth or length of approximately thirteen millimeters, and a constant pitch. The coil 44 forms an antenna that is essentially a hybrid between a conventional coil antenna, which usually has a smaller pitch, and a conventional helical antenna, which usually has one open or unconnected end.

Figure 2:
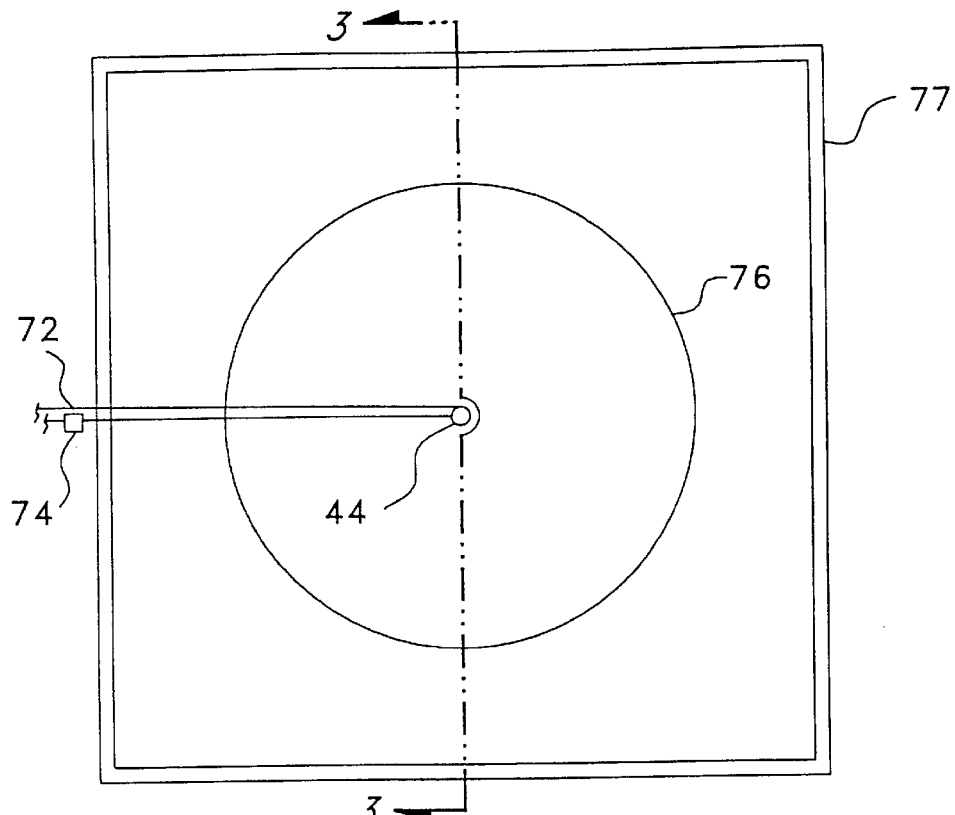
FIG. 2 is a top view of a coil, Lucite™ cylinder, and open copper box used in the apparatus of FIG. 1.
Figure 3:
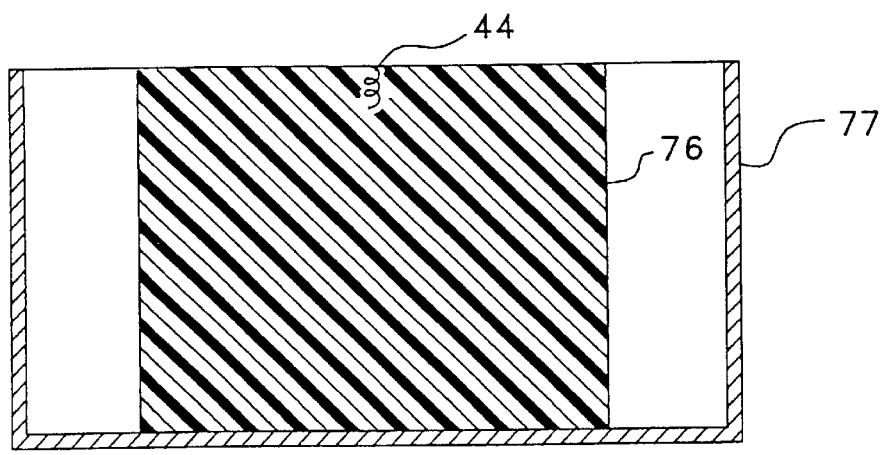
FIG. 3 is a side cross-sectional view of the coil, Lucite™ cylinder, and open copper box of FIG. 2, taken along the line 3—3 of FIG. 2.

Empirical testing has shown that the coil 44 is preferably positioned at the top of and within a block or cylinder 76 of material such as, for example, Lucite™ material, as illustrated in FIGS. 2 and 3. The cylinder 76 may comprise dielectric materials other than Lucite™ material. The Lucite™ material has a static dielectric constant of approximately 3.6 which alters the directivity of the antenna formed by the coil 44. The Lucite™ material also protects and immobilizes the coil 44 and helps maintain the proper positioning of the coil 44 relative to the semiconductor sample 32. Empirical testing has shown that it is useful in producing the desired functions of the invention to have the coil 44 embedded in a cylinder of the Lucite™ material having a diameter of 6.4 centimeters, and a length of five centimeters. The coil 44 and the cylindrical Lucite™ material are preferably placed within a copper box 77 having a length of ten centimeters, a width of ten centimeters, and a height of five centimeters. The cylinder is preferably positioned in the center of the bottom surface of the copper box 77. Therefore, the top of the coil 44 is at the top of the copper box 77. The space interior space of the box 77 between the walls of the box 77 and the Lucite™ material is left empty except for ambient air. The box 77 preferably has no top or is open ended at the top.

Positioning the coil 44 within the cylinder 76 and the copper box 77 affects the directivity of the antenna created by the coil 44. Thus, changing the size, shape, dielectric constant, and/or material of the cylinder 76 and/or the box 77 may affect the operating mode of the antenna formed by the coil 44 and the resulting radiation resistance and directivity created by the coil 44. In addition, changing the diameter of the coil 44 may also alter the operating mode of the antenna formed by the coil 44 and the resulting radiation resistance and directivity created by the coil 44. The copper box 77 is believed to act as a four corner reflector for the coil 44 such that the box 77 plus the cylinder 76 act like a collimating lens or waveguide for the electromagnetic radiation created by the coil 44 when electric current flows through the coil 44. In addition, the box 77 may act as or behave like a resonant cavity, the properties of which may be affected by the frequency $f_o$ or the value for the capacitor 66. The capacitor 66 acts as an impedance matcher between the coil 44 and the remainder of the system 30, particularly since the coil 44 will create radiation resistance when generating electromagnetic radiation, the impedance of the capacitor 66 being dependant on the frequency $f_o$. The dielectric properties of the cylinder 76 slow down the propagation of the electromagnetic radiation produced by the coil 44, at least when compared to propagation through free space. The dielectric properties of the sample 32 may also affect the electromagnetic radiation created by the coil 44 or alter the directivity of the coil 44. During empirical testing of the system 30, the coil 44, the cylinder 76, the box 77, the sample 32, and the light source 34 were placed within a hollow and enclosed aluminum box (not shown) approximately sixty centimeters long, approximately forty-five centimeters wide, and approximately forty centimeters tall to shield the sample 32 from stray light sources. The box 77 was placed approximately in the center of the bottom inner surface of the aluminum box. The aluminum box may also have had an affect on the directivity of the coil 44.

Figure 4:
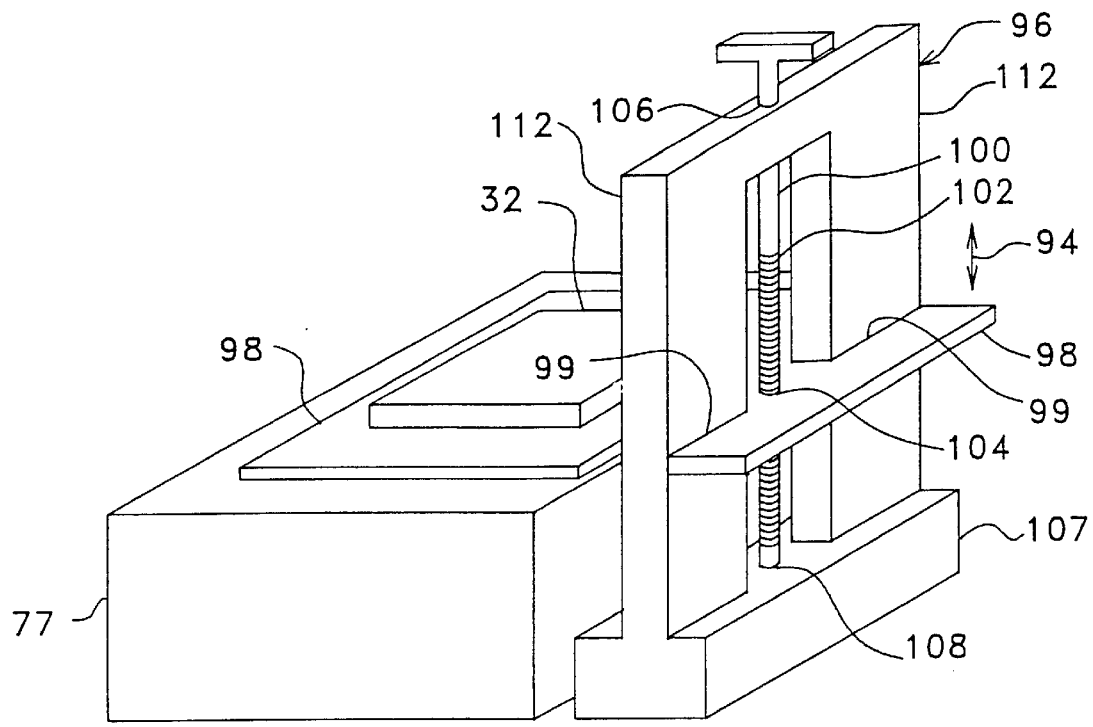
FIG. 4 is an isometric view of a positioner used in the apparatus of FIG. 1 to position a semiconductor sample relative to the coil positioned inside the copper box.
Figure 5:
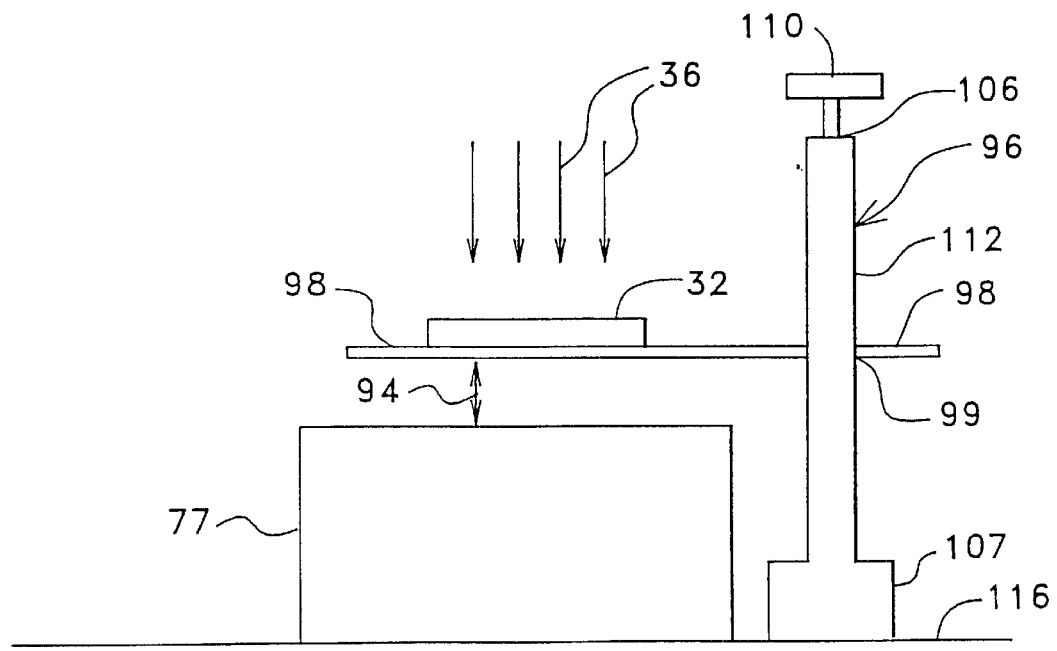
FIG. 5 is a side view of the positioner and block of FIG. 4.

Another important feature of the apparatus 30 is that the sample 32 can be moved relative to the coil 44, as indicated by the arrow 94 in FIGS. 1, 4–5. A simple positioning device for the sample 32 is illustrated diagrammatically in FIGS. 4 and 5 although any apparatus that can support and move the sample 32 in relation to the coil 44 would be satisfactory for this invention. For purposes of simple illustration of the location of the positioner 96 and the box 77, the cylinder 76 and the coil 44 are not illustrated in FIGS. 4, 5.

Now referring to FIGS. 4 and 5 simultaneously, the sample 32 is positionable relative to the coil 44 and the block 76 (concealed by the box 77 in FIGS. 4 and 5) by the positioner 96. The positioner 96 includes the platform 98 upon which the sample 32 is positioned and supported. The platform 98 may constitute the dielectric slide 78 previously discussed above or may be in addition to the dielectric slide 78. The platform 98 includes two slots 99 that fit snugly about the walls 112 so as to guide or direct the platform 98 during upward or downward movement of the platform 98 in relation to the coil 44 and to prevent tilting or shifting of the platform 98.

The positioner 96 includes a rod 100 (not shown in FIG. 5) that is journaled in hole 106 at one end and in hole 108 at the other end and has external threads 102 extending along a length of the midsection of rod 100. The external threads 102 on the rod 100 mate with internal threads (not shown) located on the inside of the bore 104 of the platform 98 to raise and lower the platform as the rod is rotated. The rod cap 110 allows the rod 100 to be rotated clockwise or counterclockwise, thereby causing the platform 98 to move up or down, respectively, which in turn allows the sample 32 to move up or down relative to the block 76 and the coil 44.

The thickness of the platform 98 and the wall 112, and the diameter of the rod 100, should be sufficiently large to prevent the platform 98 from tilting or otherwise being unsteady or non-level. The base 107 should also be of sufficient weight and dimension to ensure that the positioner 96 is stable on the surface 116. While the positioner 96 is provided as an illustrative example of how the sample 32 can be positioned and moved relative to the coil 44 and the block 76, persons of skill in this art will be aware of other positioning systems or devices that can be used with the apparatus 30 to move and position the sample 32 relative to the coil 44 and the block 76. Therefore, many different types of positioners, including both manually operated and electrically operated positioners, can be used in the apparatus 30 and the specific structure of the positioner 96 disclosed herein facilitates, but does not constitute, the invention.

Figure 6:
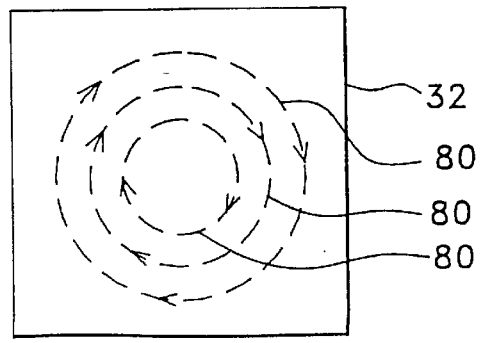
FIG. 6 is plan view of a semiconductor sample illustrating the electric eddy currents induced in the sample when the sample is illuminated with the semiconductor photoconductive decay measuring apparatus of FIG. 1.

As discussed briefly above, it is also believed, although not known for certain, that illuminating the semiconductor sample 32 with the light beam 36 may induce eddy currents 80 (see FIG. 6) of electricity in the semiconductor sample 32, which eddy currents would generate a magnetic field perpendicular to the eddy currents 80 and, as a result, may create a mutual inductance and/or coupled impedance between the sample 32 and the coil 44. Such mutual inductance and/or coupled impedance, it is believed, can be altered by the photoconductance $G_L$ of the sample 32 and, as a result, also alter the electrical characteristics of the bridge circuit 42 to create a voltage signal $V_{OUT}$ at the nodes 46, 47. Regardless of whether this hypotheses and explanation is completely correct, it is known from empirical testing and observations that the voltage signal $V_{OUT}$ is indicative of the minority carrier lifetimes or recombination rates of the semiconductor sample 32, as will be discussed in more detail below.

The importance and benefits of the linear relationships between changes in the input impedance $Z_{IN}$ and the photoconductance $G_L$ of the sample 32 will now be illustrated in more detail with regard to several specific sample examples. For each of the following examples, the resistors 60, 62, 64 in the bridge circuit 42 are assumed to be fifty ohms each while the capacitor 66 in the bridge circuit 42 is assumed to be twenty picofarads, although other resistance and capacitance values can also be used.

Figure 7:
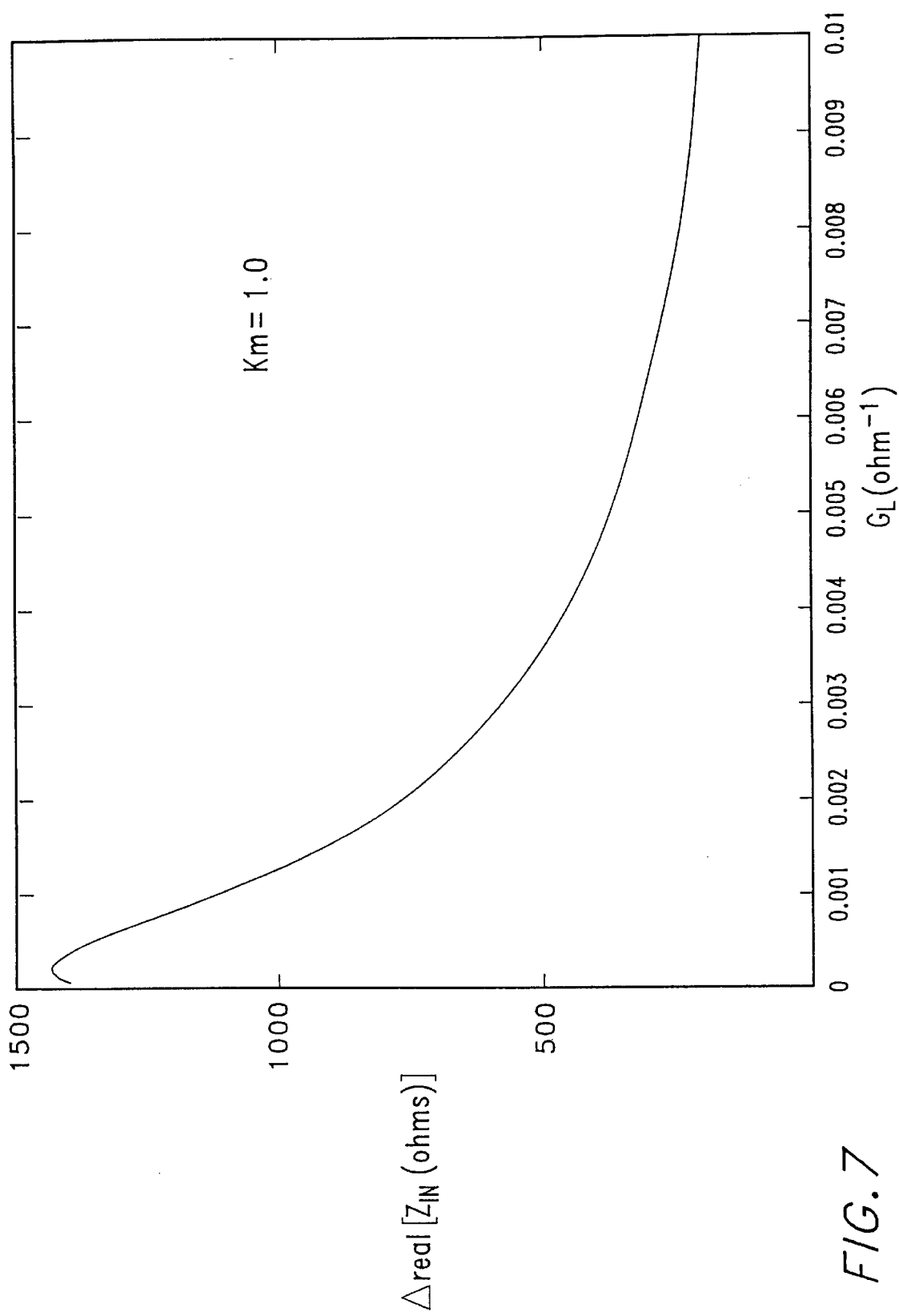
FIG. 7 is a graph of the real portion of the input impedance of the apparatus of FIG. 1 versus sample photoconductance using a mutual inductance coupling coefficient $K_m$ equal to 1.0.

When the mutual inductance and/or coupled impedance between the coil 44 and the sample 32 is too high, the apparatus 30 does not exhibit either linearity or sensitivity. For example, if the mutual inductance coupling coefficient $K_m$ is equal to one (i.e., the spacing between the coil 44 and the sample 32 is very small) and the oscillator frequency $f_o$ is equal to 425 MHz, the graph shown in FIG. 7 is obtained for varying values of sample photoconductance $G_L$. The sample 32 used in this example is a simulation of a typical laboratory sample.

Figure 8:
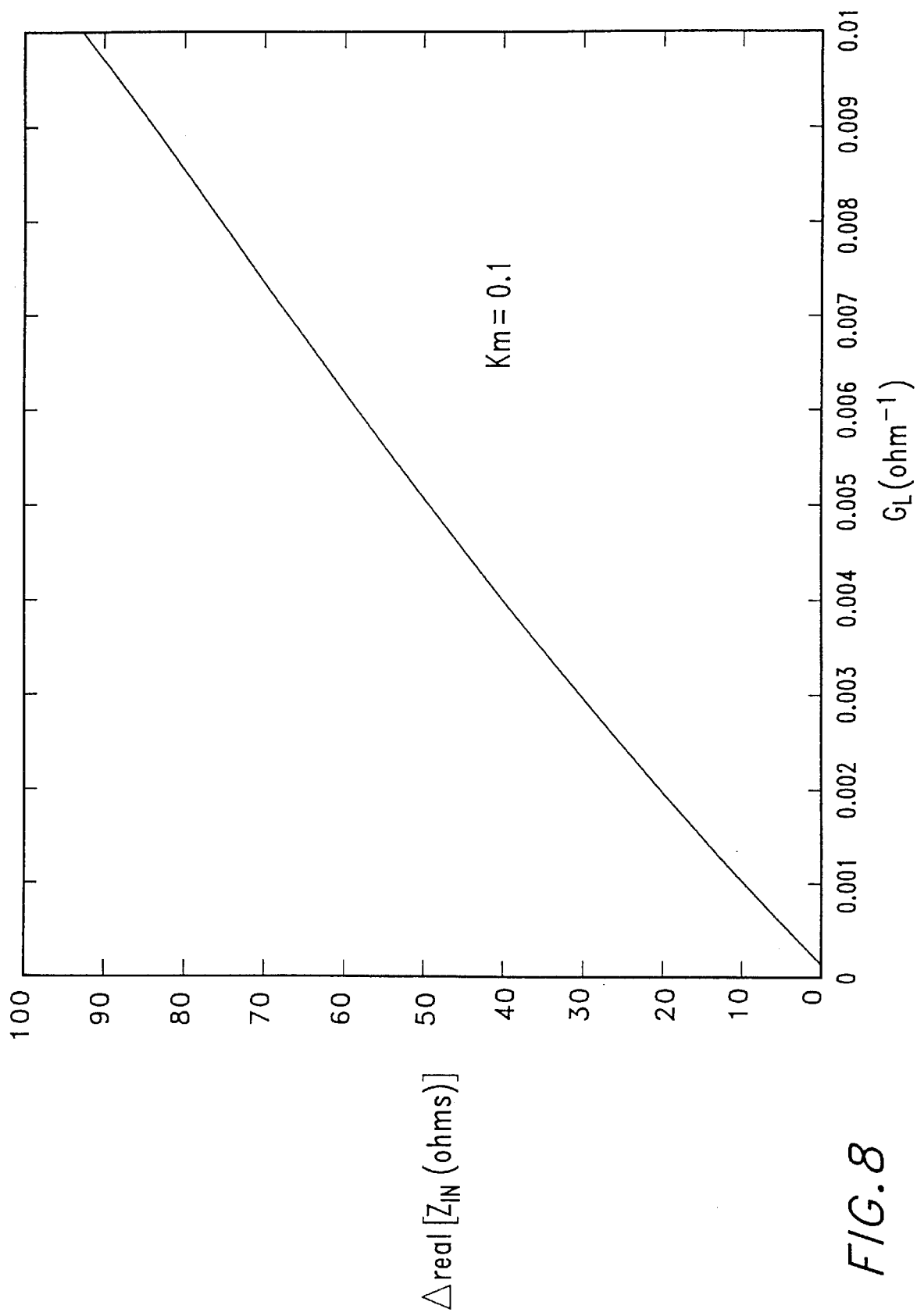
FIG. 8 is a graph of the real portion of the input impedance of the apparatus of FIG. 1 versus sample photoconductance using a mutual inductance coupling coefficient $K_m$ equal to 0.1.
Figure 9:
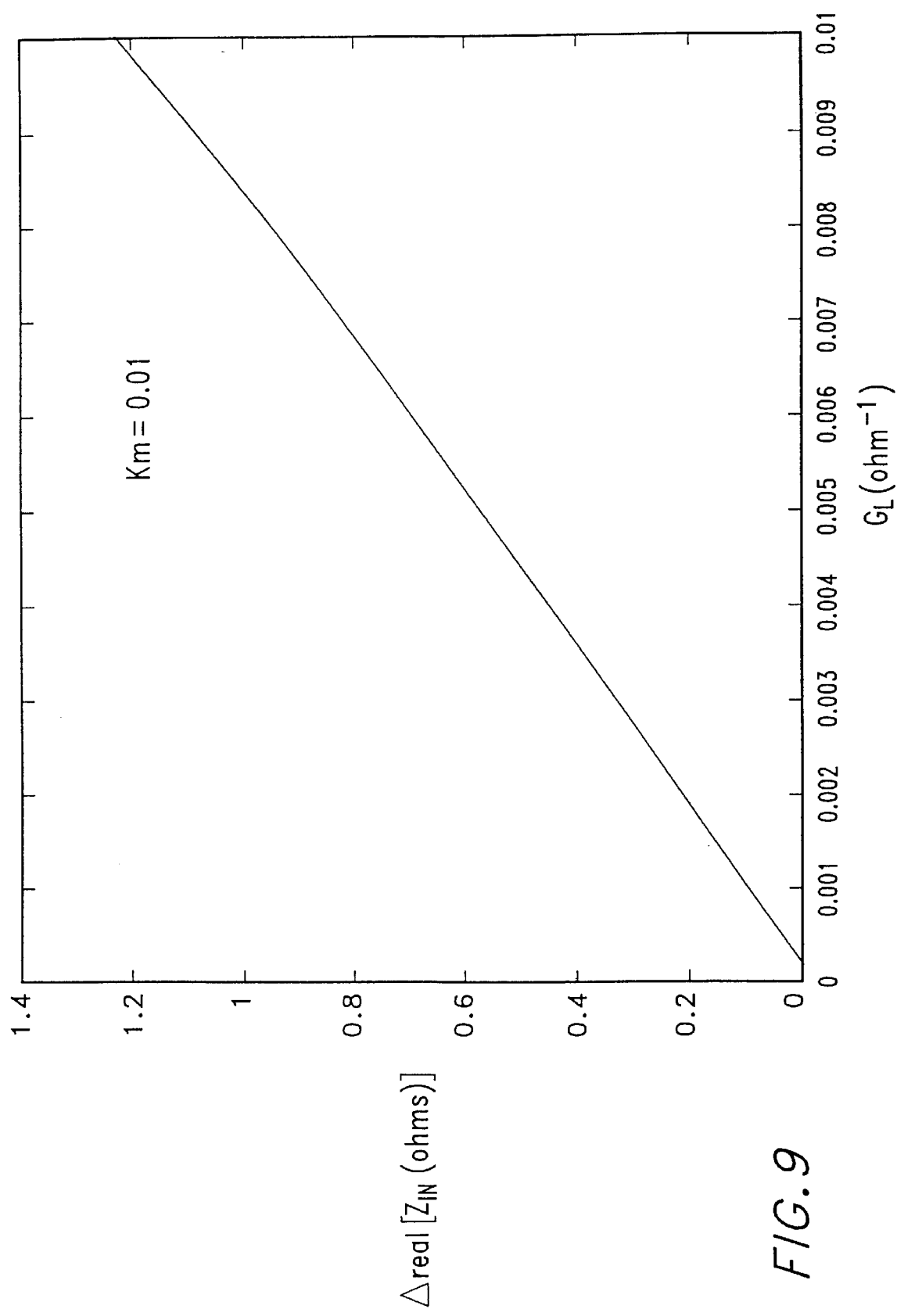
FIG. 9 is a graph of the real portion of the input impedance of the apparatus of FIG. 1 versus sample photoconductance using a mutual inductance coupling coefficient $K_m$ equal to 0.01.

In this example, apparatus 30 does not possess linearity since the real portion of the input impedance $Z_{IN}$ does not increase linearly as the photoconductance $G_L$ of the sample 32 increases. In contrast, if the mutual inductance coupling coefficient $K_m$ is equal to 0.1 (i.e., the spacing between the sample 32 and the coil 44 is increased) and the oscillator frequency $f_o$ is equal to 425 MHz, the graph shown in FIG. 8 is obtained for a range of values of sample photoconductance $G_L$. In the second example, for the same sample 32 as the first example, the apparatus 30 does display linearity since the real portion of input impedance $Z_{IN}$ increases linearly as the photoconductance $G_L$ of the sample 32 increases. An example of the linearity of the apparatus when the mutual inductance coupling coefficient $K_m$ is 0.01 and the oscillator frequency $f_o$ is 425 MHz for the same sample 32 as the previous two examples is illustrated in FIG. 9. Obviously, in a similar fashion to the example discussed above in relation to FIG. 8, the apparatus 30 displays linearity due to the weak coupling and weak mutual inductance and/or coupled impedance created between the coil 44 and the sample 32, which is a result of the weak magnetic coupling between the coil 44 and the sample 32.

Figure 10:
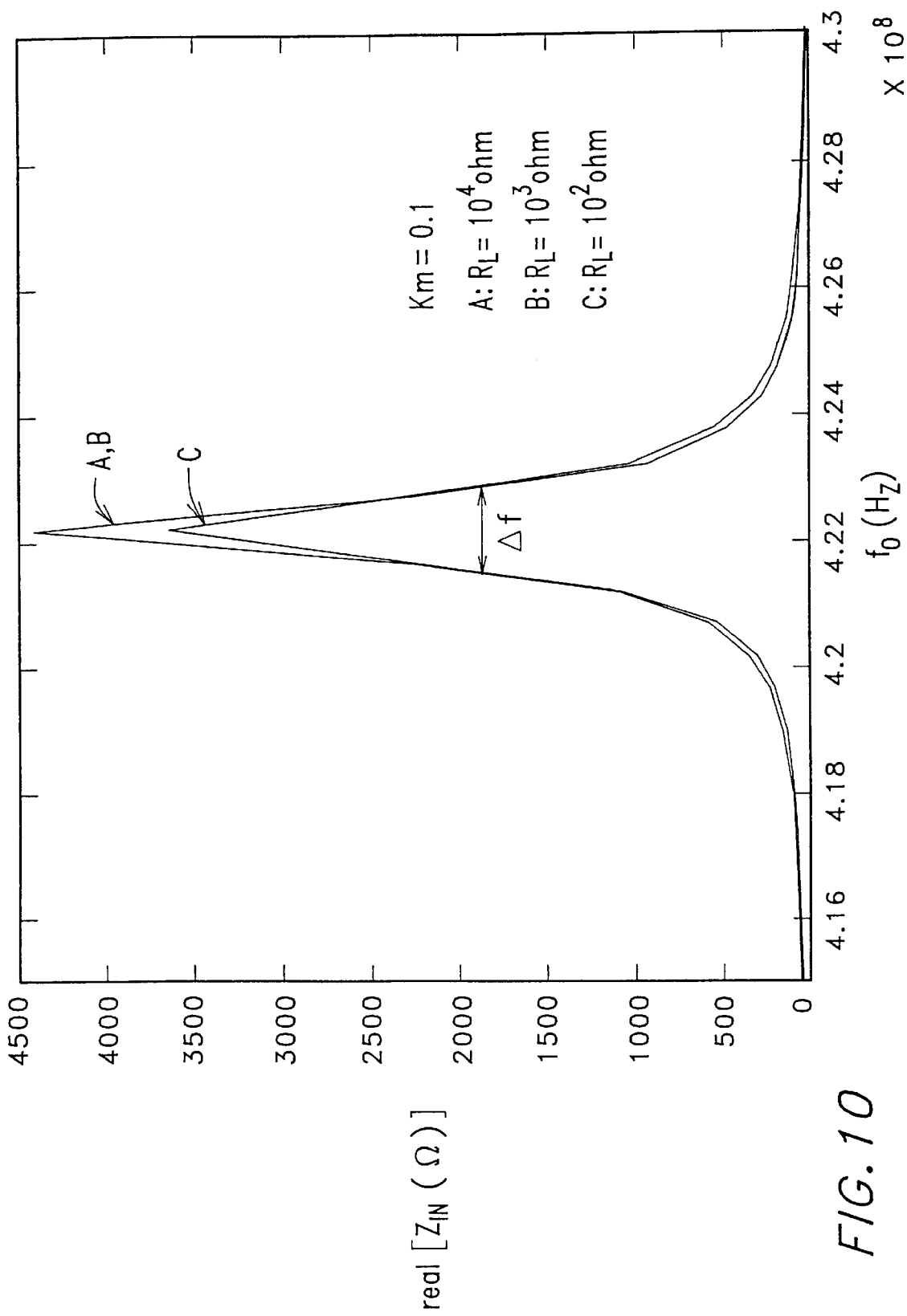
FIG. 10 is a graph of the real portion of the input impedance of the apparatus of FIG. 1 versus oscillator frequency $f_o$ using a mutual inductance coupling coefficient $K_m$ equal to 0.1 for three different values of sample resistance.
Figure 11:
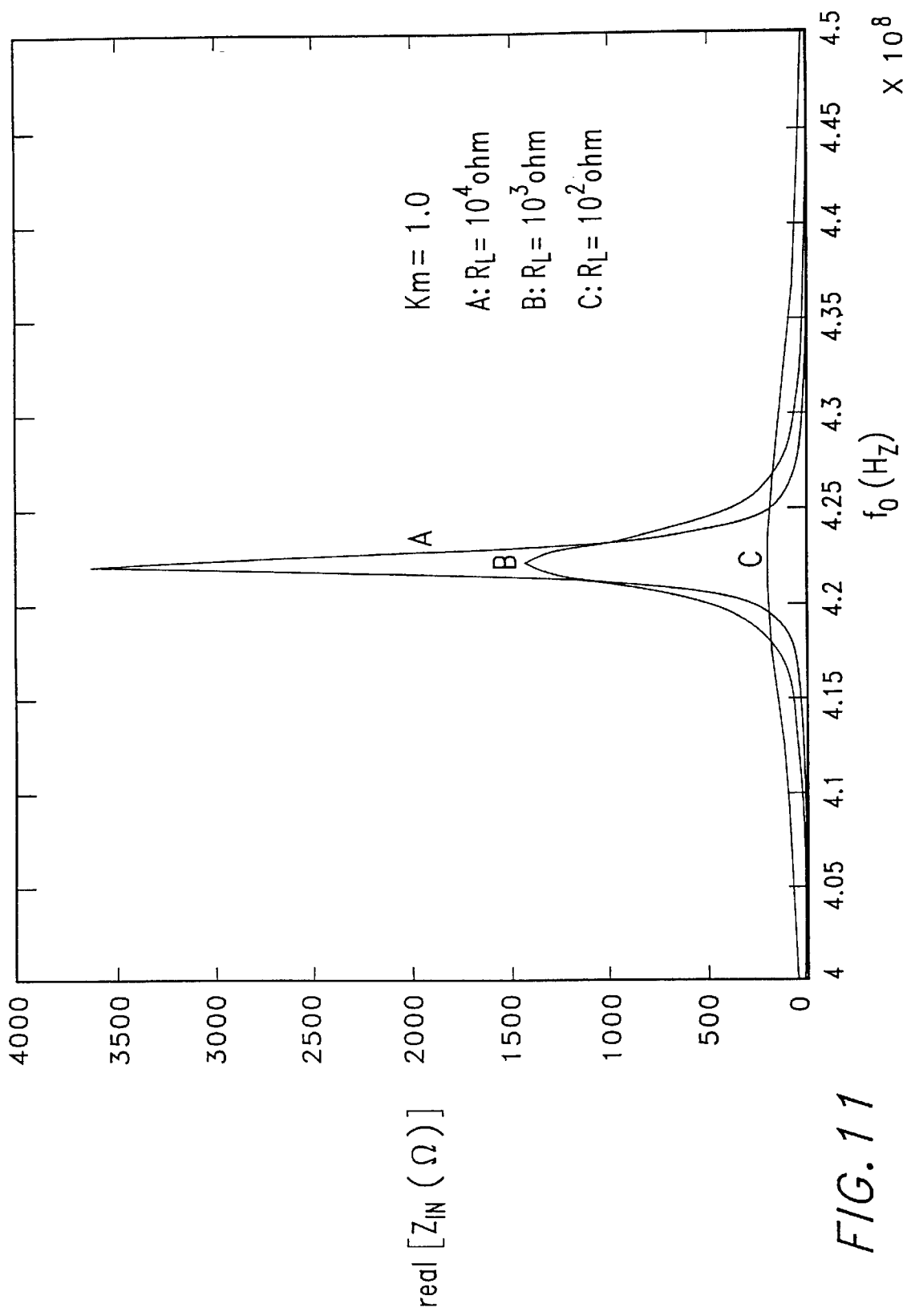
FIG. 11 is a graph of the real portion of the input impedance of the apparatus of FIG. 1 versus oscillator frequency $f_o$ using a mutual inductance coupling coefficient $K_m$ equal to 1.0 for three different values of sample resistance.

As previously discussed above, in order to obtain a high sensitivity for the apparatus 30, a large amplitude, high frequency, output voltage signal $V_{OUT}$ must be obtained between the nodes 46, 47 of the bridge circuit 42 for samples having different sizes, shapes, and material properties. The voltage signal will have a frequency equal to the oscillator frequency $f_o$. The larger the impedance $Z_{IN}$ the larger the amplitude of the output voltage signal $V_{OUT}$. Therefore, maximizing the input impedance $Z_{IN}$ will increase the value of the output voltage signal $V_{OUT}$. More specifically, the sensitivity of the apparatus 30 is proportional to the slope of the input impedance $Z_{IN}$ versus frequency at any particular operating point. For example, now referring to FIG. 10, the curves A, B, C represent different values of the dark resistance $R_L$ of samples 32 for a mutual inductance coupling coefficient $K_m$ equal to 0.1. The curves A, B, C have their maximum slopes at approximately 421 MHz and 423 MHz. In addition, the curves have approximately equal slopes at these frequencies. Therefore, the apparatus 30 displays high sensitivity for values of the dark resistance $R_L$ of the sample 32 that vary several orders of magnitude. In contrast, when the mutual inductance coupling coefficient $K_m$ is equal to one, the graphs A, B, C shown in FIG. 11 are obtained for the same sample simulations. While graph A in FIG. 11 illustrates relatively good sensitivity, graphs B and C in FIG. 11 display very poor sensitivity for the apparatus 30. Therefore, as illustrated by the previous two examples, if the mutual inductance coupling coefficient $K_m$ is too high, the apparatus 30 will not display the necessary sensitivity consistently for different samples. An important feature of the apparatus 30 is that consistently high sensitivity is created by maintaining a consistently high and relatively constant input impedance $Z_{IN}$ for different samples, as illustrated in FIG. 10, and as will be discussed in more detail below.

Figure 12:
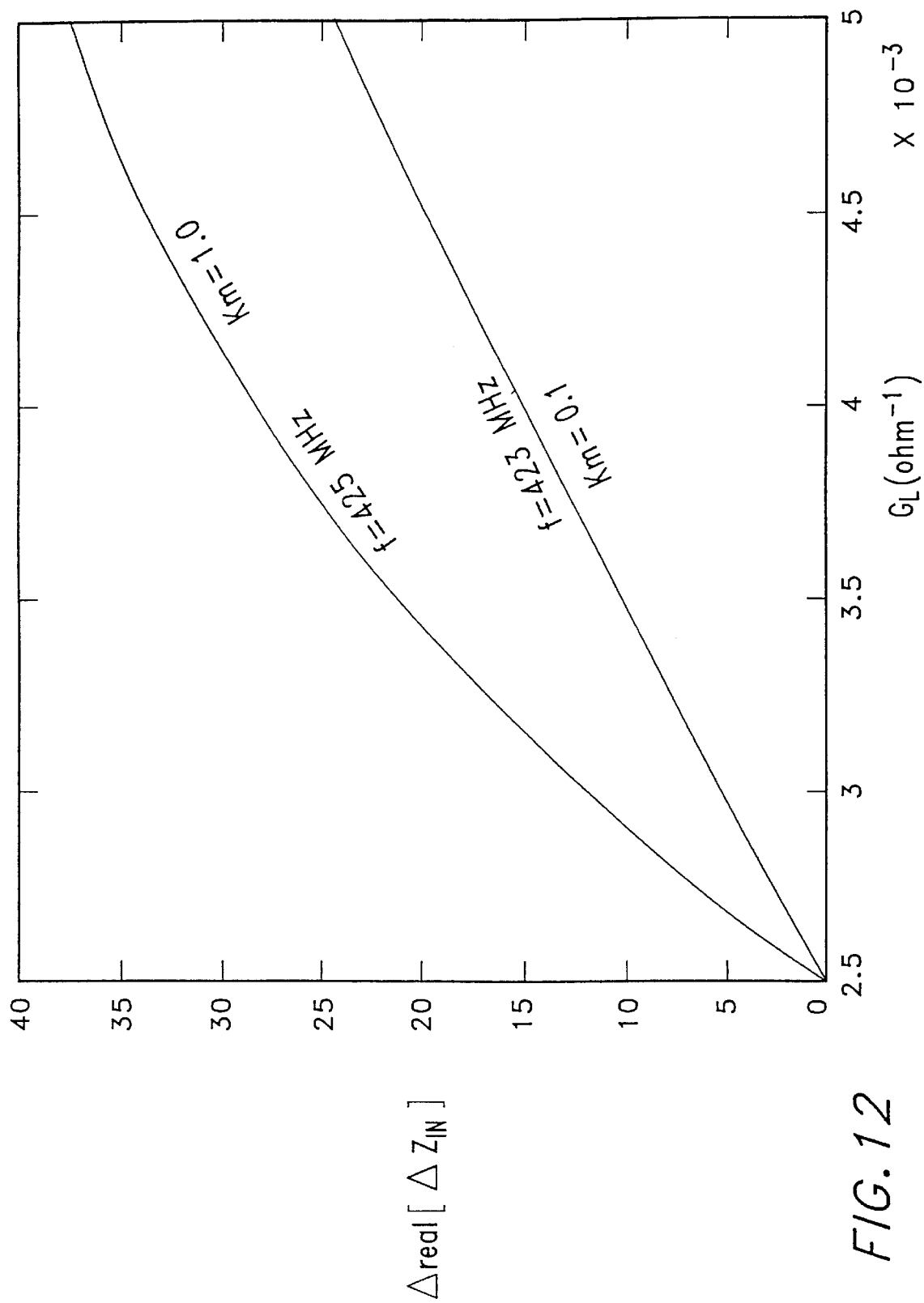
FIG. 12 is a graph of the real portion of the input impedance of the apparatus of FIG. 1 versus sample photoconductance for different values of oscillator frequency $f_o$ and a mutual inductance coupling coefficient $K_m$ equal to one.
Figure 13:
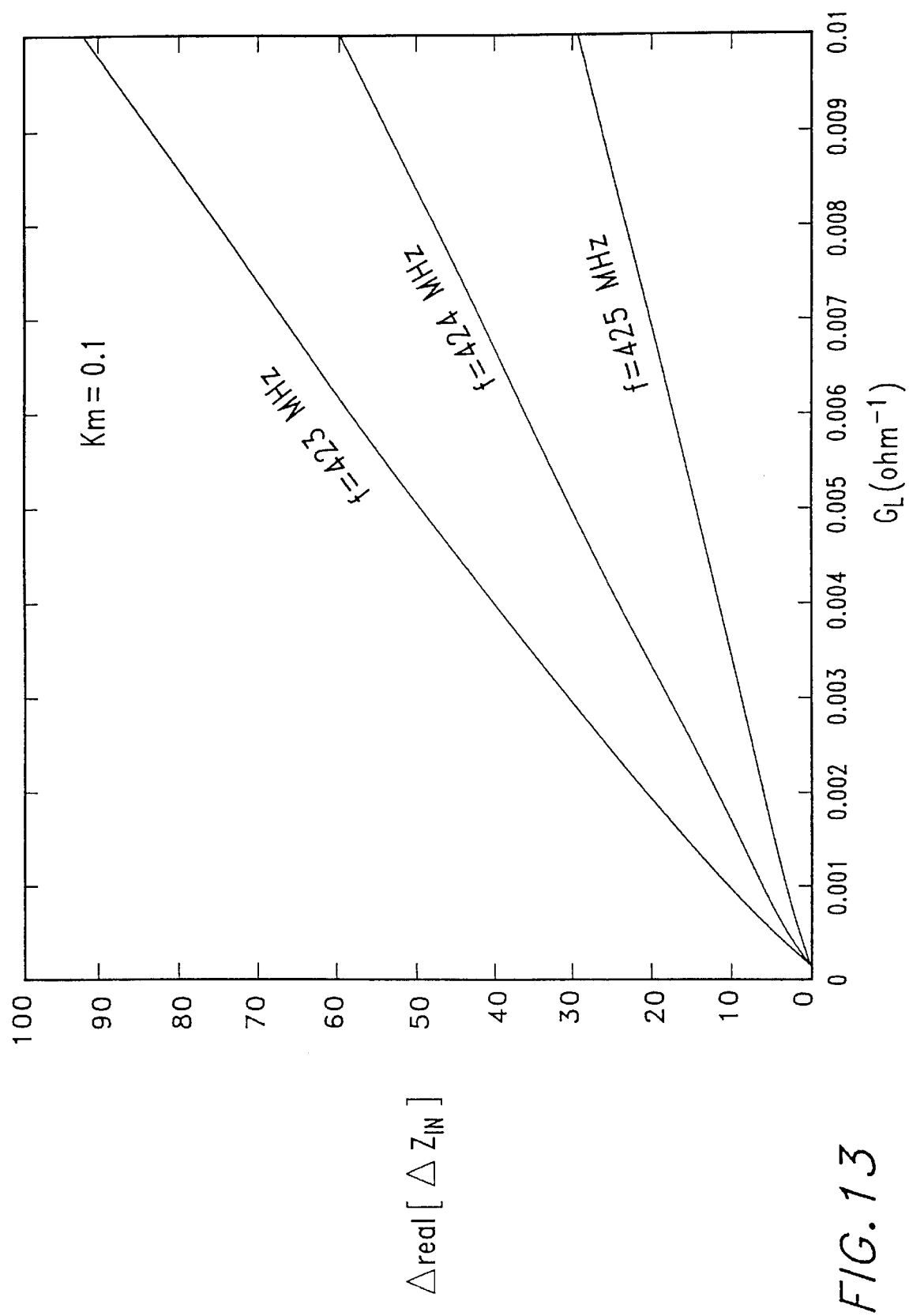
FIG. 13 is a graph of the real portion of the input impedance of the apparatus of FIG. 1 versus sample photoconductance for three different values of oscillator frequency $f_o$ and a mutual inductance coupling coefficient $K_m$ equal to 0.1.

As illustrated by the previous examples, the oscillator frequency $f_o$ is crucial to determining the maximum sensitivity of apparatus 30 while the mutual inductance coupling coefficient $K_m$ is important for determining both the linearity and sensitivity for the apparatus 30. Now referring to FIG. 12, when the apparatus 30 is configured to use an oscillator frequency $f_o$ of 425 MHz and a mutual inductance coupling coefficient $K_m$ of 1.0, the change in the real portion of the input impedance $Z_{IN}$ is non-linear with respect to the change in photoconductance $G_L$ of a sample 32. In contrast, when the apparatus 30 is configured to use an oscillator frequency $f_m$ of 423 MHz and a mutual inductance coupling coefficient $K_m$ of 0.1, the real portion of the input impedance $Z_{IN}$ is linear with respect to the photoconductance $G_L$ of a sample 32. Choosing an appropriate oscillator frequency $f_o$ is important, as illustrated in FIG. 13, to obtain the maximum value of the sensitivity and, as a result, the maximum value for the output voltage signal $V_{OUT}$. For the example configuration of the apparatus 30 illustrated in FIG. 13, the apparatus 30 exhibits its highest sensitivity, (i.e., its highest measurable output voltage signal $V_{OUT}$) when the oscillator frequency $f_o$ is 423 MHz.

Figure 14:
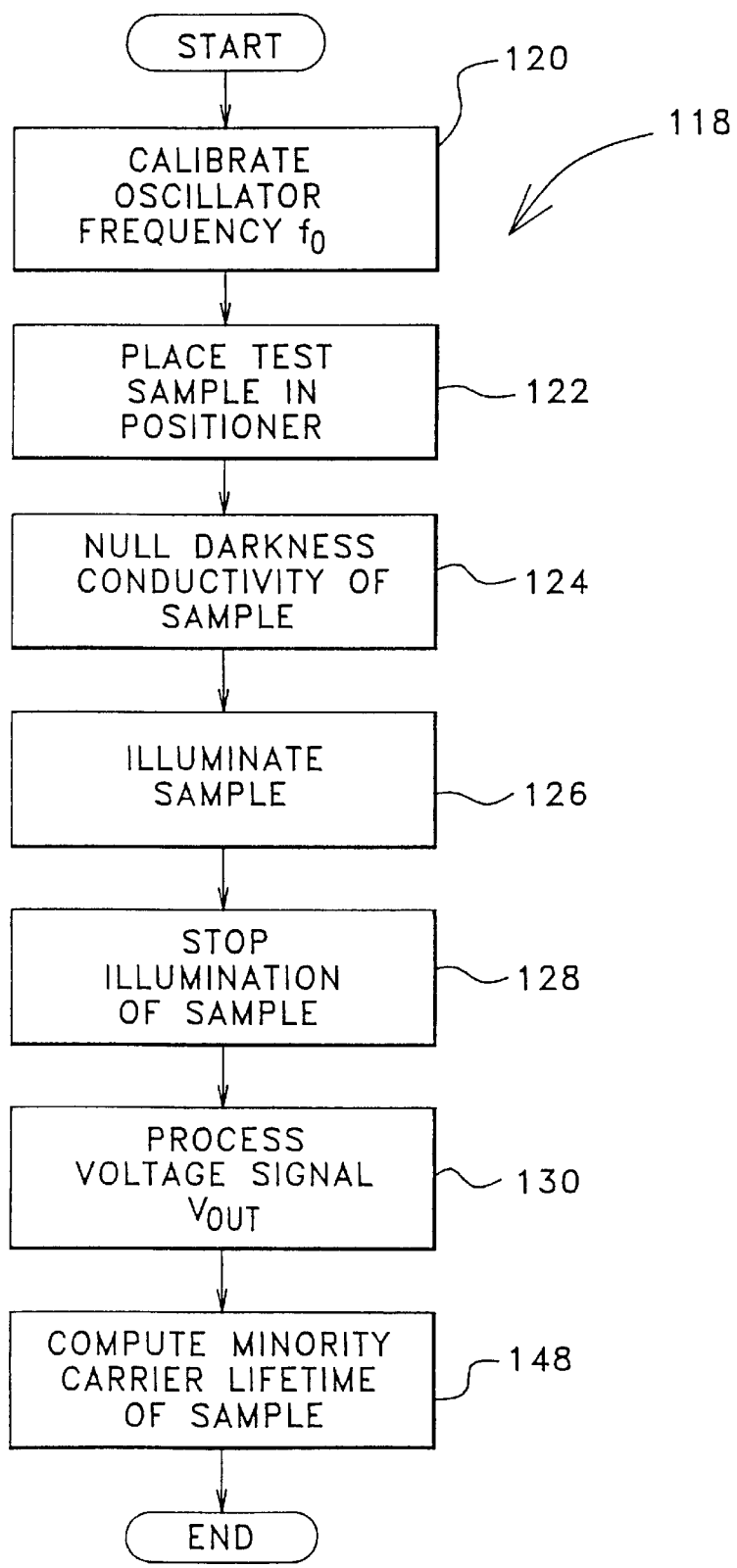
FIG. 14 is a flow chart of the method of the present invention that can be used with the measuring apparatus of FIG. 1.
Figure 15:
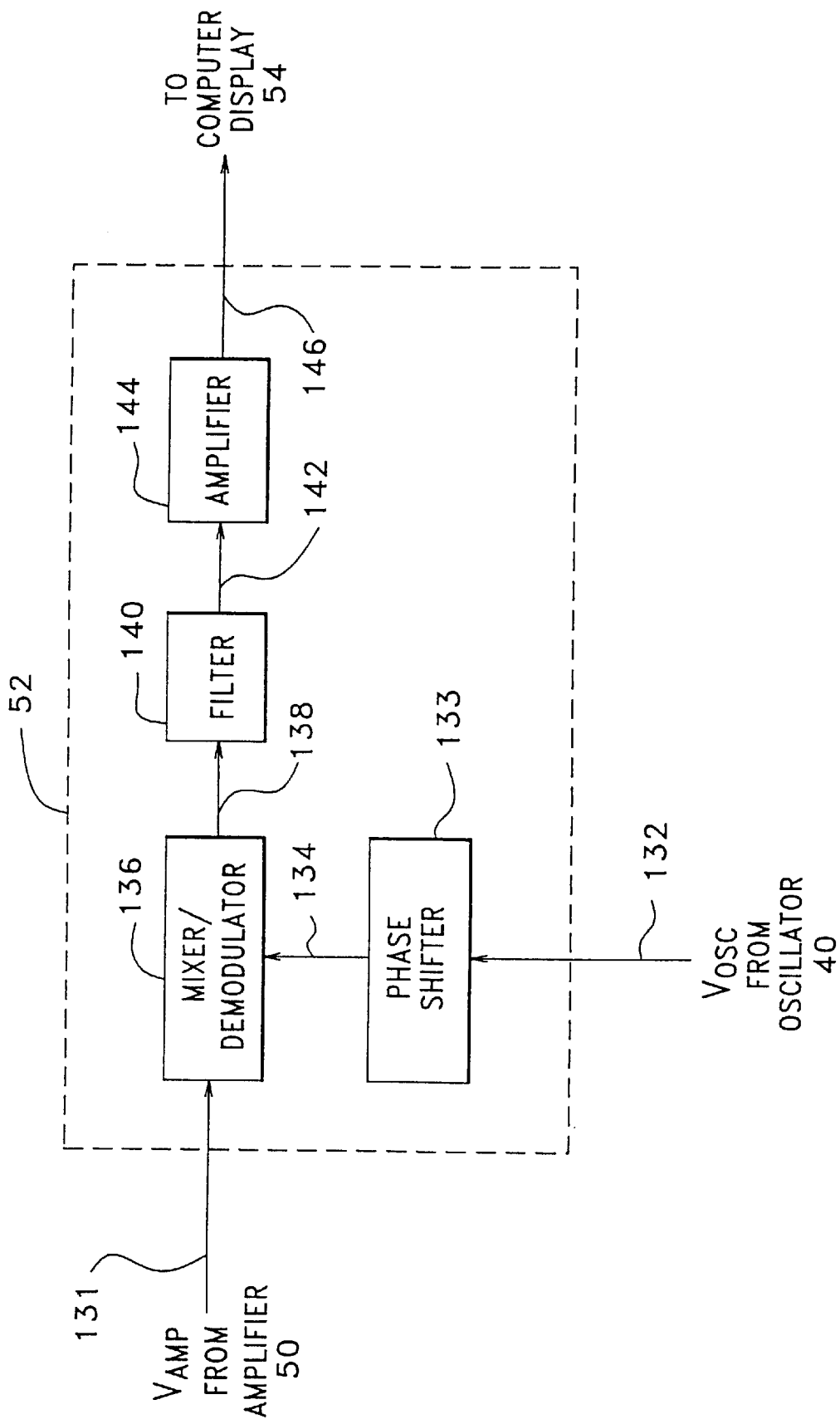
FIG. 15 is a more detailed functional block diagram of the signal processor of the apparatus of FIG. 1.

The operation of the measuring apparatus 30 will now be discussed in more detail. For purposes of illustration, but not limitation, the operation of the apparatus 30 will also be discussed in conjunction with the operational flow chart 118 provided in FIG. 14.

Prior to testing the first sample 32 with any particular configuration of the apparatus 30, the optimum oscillator frequency $f_o$ for the apparatus must be chosen in step 120. Since the resistors, capacitors, and other electrical components in the system 30 may have variable values for different configurations of the apparatus 30, an optimum oscillator frequency $f_o$ must be determined empirically for each apparatus. As previously discussed above, to optimize the sensitivity of an apparatus 30, the oscillator frequency $f_o$ should be chosen such that a maximum voltage signal $V_{OUT}$ is obtained after illumination of the sample 32, which occurs when the real portion of the input impedance $Z_{IN}$ is at a maximum. Therefore, for a given configuration for the apparatus 30, the preferred oscillator frequency $f_o$ can be determined by varying the mutual inductance and/or coupled impedance between a sample 32 and the coil 44 and the oscillator frequency $f_o$ until the oscillator frequency $f_o$ producing the highest output signal $V_{OUT}$ is obtained.

During the calibration step 120, it is preferred that the mutual inductance and/or coupled impedance between the sample 32 and the coil 44 be adjusted for maximum signal response. An example result of the set oscillator frequency step 120 is illustrated in FIG. 13, wherein graphs of the real portion of the simulated input impedance $Z_{IN}$ versus sample photoconductance $G_L$ are provided for three different oscillator frequencies. The mutual inductance coupling coefficient $K_m$ is equal to 0.1 for this example. After the oscillator frequency $f_o$ is determined for a particular apparatus 30, the oscillator frequency $f_o$ is preferably not changed during the testing of samples unless the electrical configuration of the apparatus 30 is changed. By maintaining a constant oscillator frequency $f_0$, the apparatus will display a maximum sensitivity, even for semiconductor samples of very different sizes, shapes, and material properties. While it is preferable during step 120 that only the oscillator frequency $f_o$ be adjusted, the value for the capacitor 66 can also be adjusted during step 120 in conjunction with the adjustment of the oscillator frequency $f_o$ to provide the apparatus 30 with a high sensitivity. In a similar fashion to the oscillator frequency $f_o$ however, once step 120 is completed for an apparatus 30, the value for the capacitor 66 should not be changed or adjusted during the use of the apparatus 30 to test samples so that the apparatus 30 maintains its high sensitivity unless changing the value of the capacitor 66 is necessary to balance the bridge circuit 42 during the balancing step 124.

After the oscillator frequency $f_o$ for the apparatus 30 is determined during the calibration step 120, the apparatus 30 can be used to measure the minority carrier lifetimes of semiconductor samples. For a particular test, a sample 32 is preferably placed in the positioner 96 during step 122 such that the sample 32 is generally centered over the coil 44. After positioning of the sample 32 during step 122, the null darkness or dark conductivity effects of the sample 32 are removed during step 124 by moving the position of the sample 32 relative to the coil 44 with the positioner 96 or other suitable device until the voltage signal $V_{OUT}$ between the nodes 46, 47 equals approximately zero volts. Dark conductivity refers to the chemical conductivity of a semiconductor material exhibited by the semiconductor material in darkness or when the semiconductor material is not being illuminated. By balancing the bridge circuit 42 prior to illumination of the sample 32 during illumination step 126, the voltage signal $V_{OUT}$ signal detected between the nodes 46, 47 during and after the illumination step will be representative of only the electrical photoconductivity of sample 32 created by the illumination of the sample 32

$$Z_{46,68} Z_{47,70} = Z_{47,68} Z_{46,70}$$

by the laser or other light source 34. In order to balance the bridge circuit 42, the sample 32 is moved by the positioner 96 relative to the coil 44 until the voltage signal $V_{OUT}$ between the nodes 46, 47 is approximately zero volts, which is obtained when:where $Z_{46,68}$ is the impedance between the nodes 46 and 68, $Z_{47,70}$ is the impedance between the nodes 47 and 70, $Z_{46,70}$ is the impedance between the nodes 46 and 70, and $Z_{47,68}$ is the impedance between the nodes 47 and 68. As illustrated in FIG. 1, the value for $Z_{46,70}$ is the fixed value for the resistor 64, the value for $Z_{47,70}$ is the fixed value for the resistor 62, and the value for $Z_{47,68}$ is the fixed value for the resistor 60. Therefore, the only variable in equation (1) is the value for $Z_{46,68}$ which is related to the value of $Z_{IN}$. Thus, balancing the bridge circuit 42 during step 124 requires that the impedance $Z_{46,68}$ be tuned to a constant value, despite the size, shape, and other properties of the sample 32, since the other values in equation (1) will always remain constant.

Since the oscillator frequency $f_o$ and the value for the capacitor 66 preferably remain constant during balancing step 124, in order to obtain the proper impedance $Z_{46,68}$ to balance the bridge circuit 42 during step 124, the sample 32 is moved relative to the coil 44 until the correct impedance $Z_{46,68}$ is obtained. That is, the mutual inductance and/or coupled impedance between the sample 32 and the coil 44 is adjusted until the desired impedance $Z_{46,68}$ is obtained. Maintaining a constant impedance $Z_{46,68}$ for various samples by only adjusting the distance between the sample 32 being tested and the coil 44 insures that the apparatus 30 remains linear and displays consistently high sensitivity, regardless of the sample being tested. That is, the input impedance $Z_{IN}$ remains linearly related to the photoconductance $G_L$ of the samples being tested, and the apparatus produces consistently measurable and accurate voltage signal $V_{OUT}$, as previously discussed above. A consistently linear and highly sensitive apparatus 30 cannot generally be maintained for a wide range of sample sizes and conductivities with the mutual inductance and coupled impedance fixed. The bridge circuit 42 can generally be balanced in this case by adjusting the oscillator frequency $f_o$ and the value for the capacitor 66 after the apparatus is configured during step 120.

The balancing of the bridge circuit 42 during step 124 is preferably accomplished by adjusting only the distance between the sample 32 and the coil 44, which varies the mutual inductance and coupled impedance between the sample 32 and the coil 44. The oscillator frequency $f_o$ is preferably not adjusted during the step 124, since frequency adjustment during step 124 will disturb the sensitivity of the apparatus 30, as previously discussed above in relation to step 120. Also, during the step 124, the sample 32 is preferably coupled with the coil 44 such that the mutual inductance and coupled impedance between the sample 32 and the coil 44 produces the same impedance $Z_I$ regardless of the sample's parameters, such as size and photoconductivity, for large samples. As previously discussed above, if the mutual inductance coupling coefficient $K_m$ and/or the coupled impedance is too high (i.e., the sample 32 is too close to the coil 44), the apparatus 30 will not be linear. By adjusting the apparatus 30 during step 120 such that the apparatus 30 maintains a high sensitivity and balancing the bridge circuit 42 during step 124 by only moving or changing the position of the sample 32 relative to the coil 44, which changes the mutual inductance and/or coupled impedance between the sample 32 and the coil 44, and not by adjusting the oscillator frequency $f_o$ during the step 124, it is believed that a suitable value for the mutual inductance coupling coefficient $K_m$ and/or coupled impedance will be maintained for each sample tested.

After the null darkness or dark conductivity effects of the sample 32 are removed during step 124 by balancing the bridge circuit 42, a light source 34 illuminates the sample 32. The pulsed light source 34 can comprise any of a variety of light sources. A laser, such as, for example, a YAG laser generating a 1.064 micrometer wavelength pulse for three nanoseconds has been used in this invention. A mode locked, cavity dumped, dye laser, a flashlamp, or a noncoherent light source are other examples of suitable light sources. As previously discussed above, the sample 32 is preferably enclosed in a chamber or room such that the sample 32 is not illuminated by sources other than the light source 34.

Illumination of the sample 32 continues until step 128 when illumination of the sample 32 is discontinued. During the step 126 when the sample 32 is being illuminated, a pulse of excess electrons and holes will be created within the semiconductor sample 32, which alters the electrical characteristics of the semiconductor sample 32, including the photoconductance $G_L$ of the sample 32 as well as the impedance $Z_{IN}$ to create a detectable and measurable voltage signal $V_{OUT}$ between the nodes 46, 47 in the bridge circuit 42. In other words, the illumination of the sample 32 during step 126 creates an unbalanced bridge circuit 42 due to the photoconductivity of the sample 32 created by the generation of excess electrons and holes in the sample 32, which changes the value for the impedance $Z_{46,68}$ in equation (1) and the impedance $Z_{IN}$, thereby creating a measurable voltage signal $V_{OUT}$ between the nodes 46, 47.

After pulsed illumination of the sample 32 during step 126, the excess electrons and holes created in the sample 32 by the illumination of the sample 32 will begin to recombine, thereby reducing the photoconductivity of the sample 32 and altering the voltage signal $V_{OUT}$ detected between the nodes 46, 47 in the bridge circuit 42. The rate of change in the voltage signal $V_{OUT}$ after the step 128 is indicative of the minority carrier lifetimes or carrier recombination rates of the sample 32, as will be discussed in more detail below.

After the pulsed illumination of the sample 32 during step 126, the voltage signal $V_{OUT}$ is processed during step 130 to obtain the portion of the voltage signal $V_{OUT}$ that is most indicative of, and useful in, the calculation of the minority carrier lifetime or excess carrier recombination rate of the sample 32 being tested. During the processing step 130, the voltage signal $V_{OUT}$ on the leads 48, 49 is first amplified by the amplifier 50. The amplifier 50 amplifies the voltage signal $V_{OUT}$ by a factor of approximately ten and provides the amplified voltage signal $V_{AMP}$ on the lead 131 connecting the amplifier 50 to the signal processor 52. The oscillator 40 also provides an input voltage signal $V_{OSC}$ to the signal processor 52 on the lead 132 which is equivalent to the signal provided on the leads 56, 58 to the bridge circuit 42. Therefore, both of the voltage signals $V_{AMP}$ and $V_{OSC}$ will have frequencies equal to the oscillator frequency $f_o$.

The signal processor 52 contains a phase shifter 133, which creates a shifted voltage signal $V_{SHIFT}$ on the lead 134 that is a phase shifted version of the voltage signal $V_{OSC}$ on the lead 132. The phase shifter 133 shifts the phase of the voltage signal $V_{OSC}$ on the lead 132 such that the voltage signals $V_{AMP}$ and $V_{SHIFT}$ are in phase. The voltage signal $V_{AMP}$ on the lead 131 and the voltage signal $V_{SHIFT}$ on the lead 134 are the input signals to the mixer/demodulator 136.

The mixer/demodulator 136 is a conventional and well known device that creates output signals representing the sum and difference of the frequencies of the two input voltage signals, $V_{AMP}$ and $V_{SHIFT}$, to the mixer/demodulator 136. Therefore, the mixer/demodulator 136 creates two voltage signals on the lead 138, a high frequency voltage signal having a frequency equal to approximately twice the oscillator frequency $f_o$ and a low frequency voltage signal $V_{FIN}$. Both voltage signals are proportional to the excess carrier density generated by the light pulse during the step 126. The high frequency voltage signal and the low frequency voltage signal $V_{FIN}$ on the lead 138 pass through the filter 140 which removes the high frequency voltage signal and passes through the low frequency voltage signal $V_{FIN}$ onto the lead 142. The low frequency voltage signal on the lead 142 can be optionally amplified by a factor of ten by an amplifier 144 and the amplified low frequency voltage signal $V_{AFIN}$ is an output voltage signal of the signal processor 52 on the lead 146 and an input signal to the computer/display or digital processing oscilloscope 54.

After the low frequency voltage signal $V_{AFIN}$ is processed by the signal processor or device 52, it is provided to the computer/display 54 on the lead 146 so that the minority carrier lifetime or recombination rate of the sample 32 can be computed and/or displayed or stored during step 148. It should be noted that there are many different mechanisms producing the minority carrier lifetime or excess carrier recombination lifetimes that can be determined from the voltage signal $V_{AFIN}$. There are even more different methods for determining the different mechanisms controlling minority carrier lifetime in materials. For example, different formulas are used to analyze the excess carrier recombination at the surface of the sample 32 than at the bulk or core of the sample 32. In addition, an instantaneous minority carrier lifetime measurement can be determined for a sample. However, instantaneous minority carrier lifetimes will vary over time for the same sample after pulsed illumination of the sample and the instantaneous minority carrier lifetime can be linear during some time intervals and non-linear during other time intervals. Persons of ordinary skill in the art are very familiar with how to determine a sample's minority carrier lifetimes or recombination lifetimes once the voltage signal $V_{AFIN}$ is obtained and, therefore, further discussions of how to compute the minority carrier lifetimes and recombination rates is not necessary for purposes of the present invention. For example, see Richard K. Ahrenkiel, Minority-Carrier Lifetime in III–V Semiconductors, in Semiconductors and Semimetals, Volume 39, Chapter 2, pp. 39–150 (1993), published by Academic Press, Inc., which is hereby incorporated by reference, for a discussion of methods for computing a semiconductor sample's minority carrier lifetime.

Figure 16:
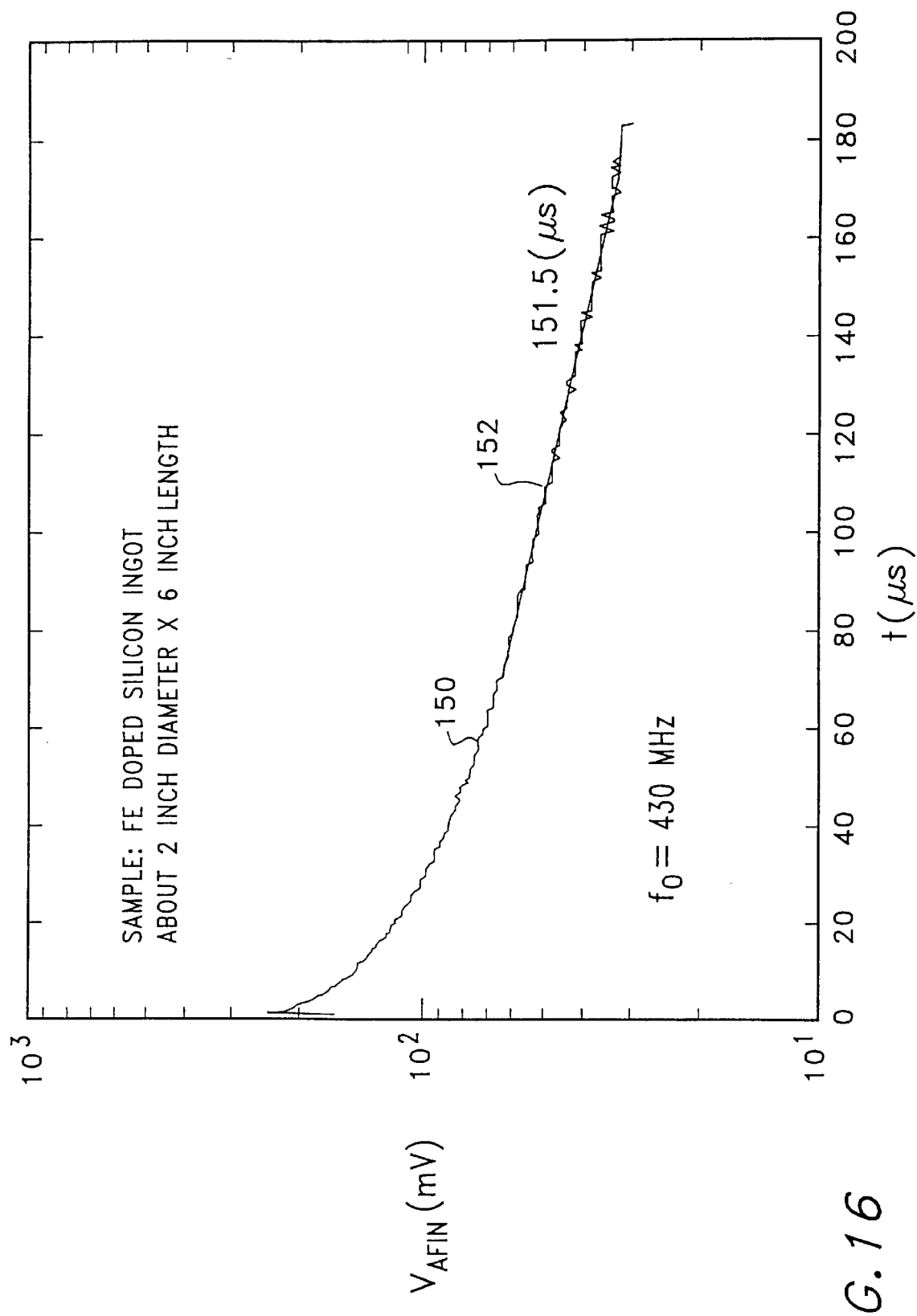
FIG. 16 is an example graph of a voltage signal $V_{FIN}$ created by the measuring apparatus of FIG. 1 and from which the minority carrier lifetime of the example sample being tested by the measuring apparatus can be determined.

An illustrative graph of a first example of the voltage signal $V_{AFIN}$ is provided in FIG. 16. The test sample comprised an iron doped silicon ingot having approximately a two inch diameter and approximately a six inch length and the oscillator frequency $f_o$ is 430 MHz. The instantaneous minority carrier lifetime of the sample is determined from the measurement the slope of the curve 150, as indicated by the line 152 that approximates the curve 150. The instantaneous minority carrier lifetime measurement can be determined from any part of the curve 150. For the example illustrated in FIG. 16, the instantaneous minority carrier lifetime of the sample under test is approximately 151.5 microseconds at the portions of the curve 150 approximated by the line 152.

Figure 17:
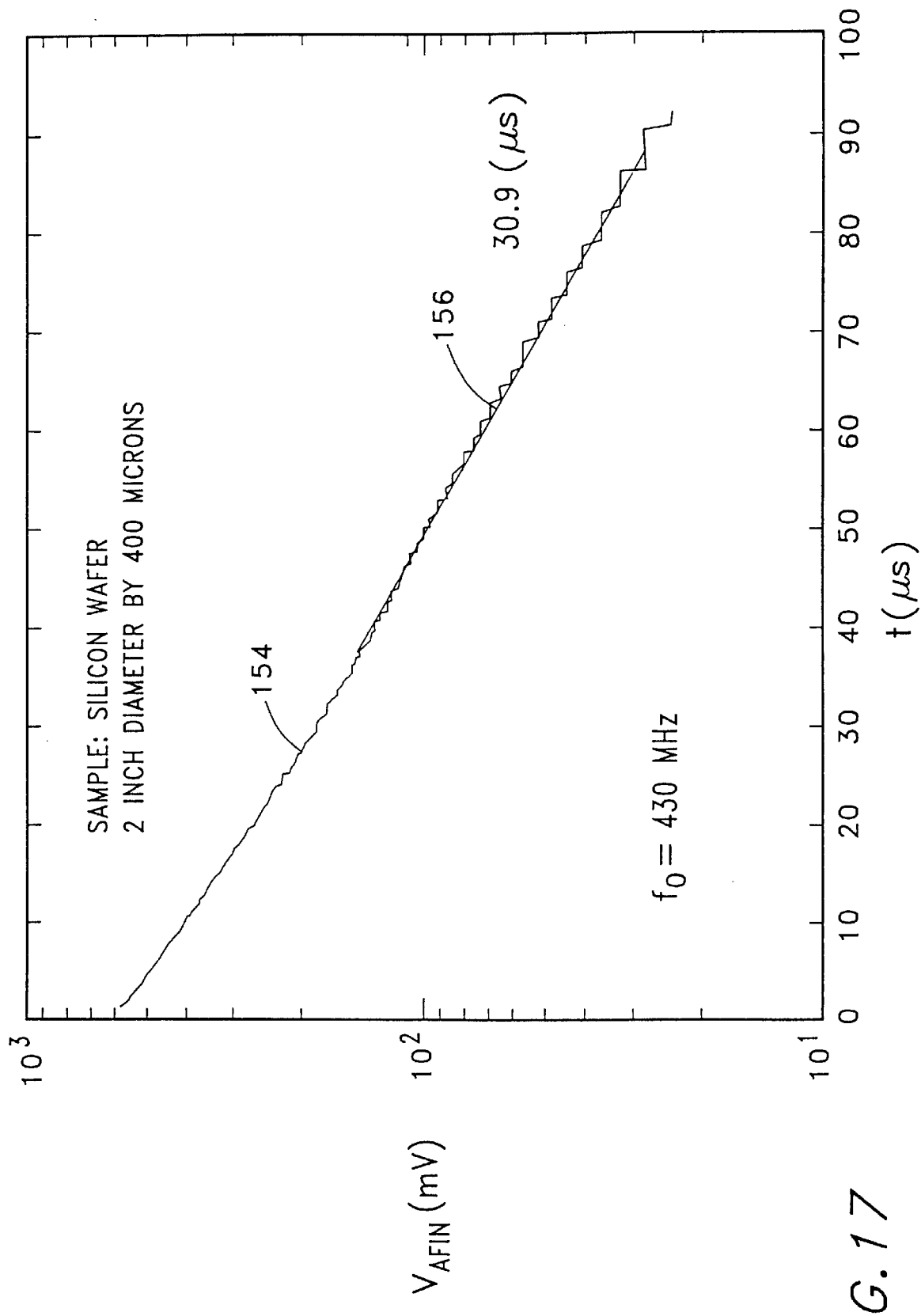
FIG. 17 is another example graph of a voltage signal $V_{FIN}$ created by the measuring apparatus of FIG. 1 and from which the minority carrier lifetime of the second example sample being tested by the measuring apparatus can be determined.

Another illustrative example of a voltage signal $V_{AFIN}$ generated by the apparatus 30 for a different test sample is provided in FIG. 17. The second test sample comprised a silicon wafer having approximately a two inch diameter and a thickness of 400 microns. Like the previous example, the oscillator frequency $f_o$ is 430 MHz. The instantaneous minority carrier lifetime of the sample is determined from the measurement the slope of the curve 154, as indicated by the line 156 that approximates the curve 154. Similar to the first example, the instantaneous minority carrier lifetime measurement can be taken at any portion of the curve 154. For the example illustrated in FIG. 17, the instantaneous minority carrier lifetime of the sample under test is approximately 30.9 microseconds at the portions of the curve 154 approximated by the line 156.

With the features and operation of the coil antenna 44 and positioner 96 understood, an explanation is now provided with reference to FIGS. 18–26 of another preferred measuring apparatus 230. The measuring apparatus 230 includes alternate circuitry and is useful with a number of antenna embodiments to provide significant advantages over prior art devices and even over the measuring apparatus 30 of FIG. 1. As will become clear from the following discussion, the measuring apparatus 230 is a contactless, nondestructive device for measuring the minority carrier lifetimes in semiconductor materials for which measurement previously was unavailable. Specifically, the measuring apparatus 230 is capable of measuring very short lifetimes, i.e., lifetimes less than 40 nanoseconds, which was not possible before (except for the measurement of lifetimes below 2 nanoseconds in direct bandgap materials with up conversion TRPL) even with the measuring apparatus 30 which has a lower measuring limit of about 40 nanoseconds. Additionally, the measuring apparatus 230 is able to measure minority carrier lifetimes in direct and indirect bandgap materials and in materials with smaller bandgap values, i.e., less than about 1.1 eV. To provide this additional measuring capacity and range of use, the measuring apparatus 230 builds fully on the concept of radio-frequency coupling of an antenna and a semiconductor sample, and uniquely combines the use of high operating frequencies, i.e., 450 to 1000 MHz or higher, with enhanced antenna designs and measuring circuitry, specifically including components necessary for creating a phase-locked measuring apparatus 230, to increase sensitivity and to lower system response times.

Figure 18:
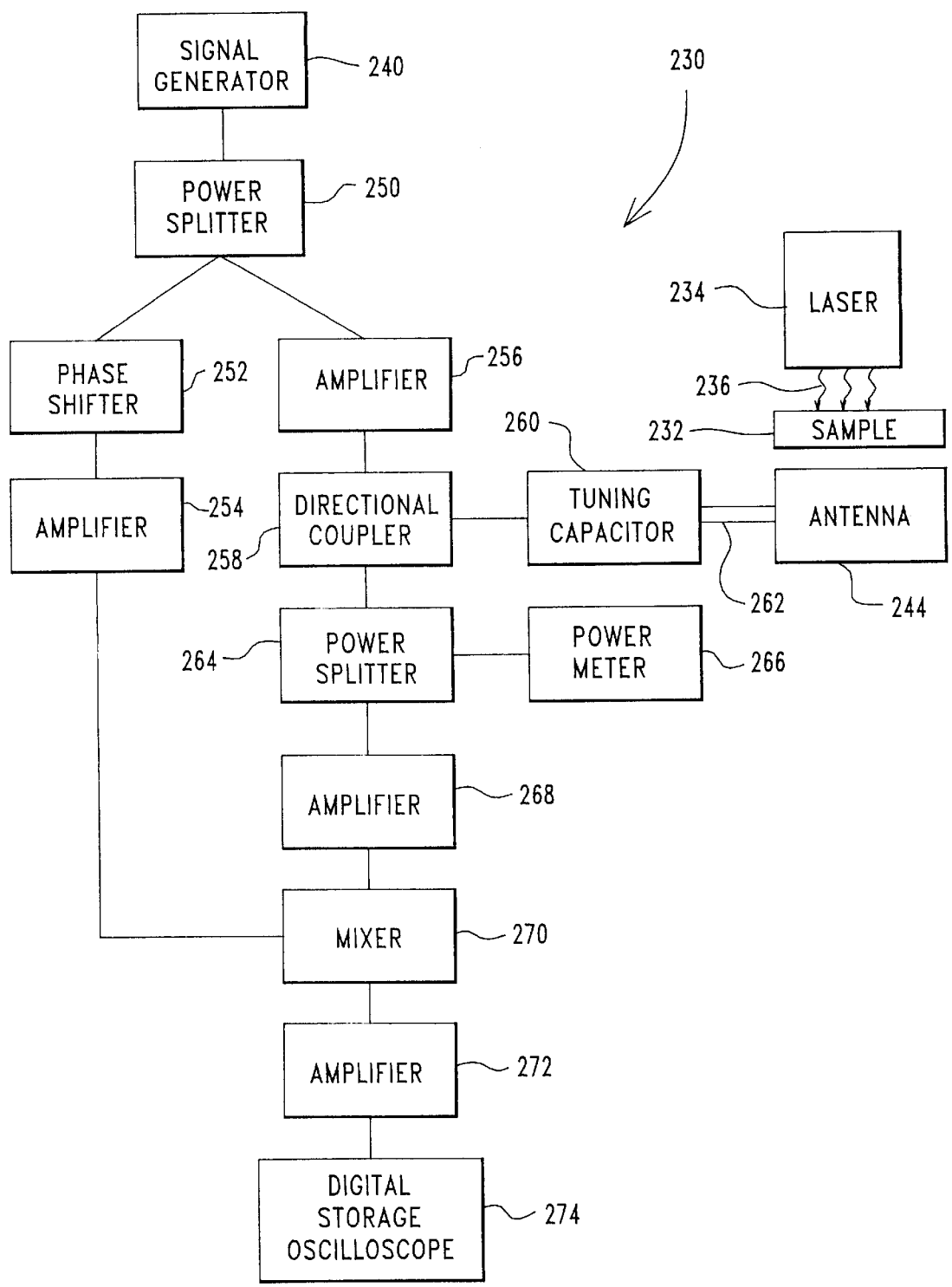
FIG. 18 is a functional block diagram of another preferred embodiment of a minority carrier lifetime measuring apparatus that includes an improved antenna and circuitry for measuring short minority carrier lifetimes.

FIG. 18 is a functional block diagram of a measuring apparatus 230 that can be used in place of measuring apparatus 30 to measure minority carrier lifetimes in any type of semiconductor material with use of an antenna 244 radiatively coupled with radio frequencies to a semiconductor sample 232. As with measuring system 30, the sample 232 can be positioned relative to the antenna 244 at a known distance with a device such as the positioner 96 illustrated in FIGS. 4 and 5 or with any other type of positioning device which allows its use in assembly line applications where the sample 232 may be moving relative to the antenna 244. Because the measuring apparatus 230 makes use of radio frequency coupling technology, the distance between the antenna 244 and sample 232 is theoretically quite large, but in practice, the distance is typically kept relatively small, such as less than about 2 feet and more preferably less than about 6 inches, to control interference and to improve the accuracy and strength of the radio signal (as will be explained in detail later) transmitted from the antenna 244 to the sample 232.

As shown, the measuring system 230 includes a signal generator 240 to produce a sinusoidal waveform signal that is transmitted to a power splitter 250 at a relatively high operating frequency, $f_{op}$, of about 400 to about 1000 MHz or higher (i.e., up to 2 GHz). The operating frequency is generally selected to be as high as practical to improve coupling efficiencies and response time of the measuring apparatus 230 but, of course, will depend on the configuration of the antenna 244, the properties of the sample 232, and the position of the sample 232 relative to the antenna 244. In one preferred embodiment, the signal generator 240 generates a sinusoidal waveform signal at an operating frequency of 900 MHz and an output power level of about 6 dBm (in a 50-ohm system). Clearly, many other output power levels may be utilized to practice the invention, and the power levels given are for illustration purposes and not as a limitation of the invention. The signal generator 240 may comprise numerous devices known to those skilled in the arts, such as a VCO chip for a printed circuit board. The power splitter 250 receives the sinusoidal waveform signal from the signal generator 240 and splits the signal into two output signals (i.e., a reference signal and a sample signal) for use in determining the minority carrier lifetimes of the sample 232. The power splitter 250 may be any well-known splitter and in one embodiment, is a Part No. ZFSC-2-2 power splitter, available from Mini-Circuits, 13 Neptune Avenue, Brooklyn, N.Y. 11235-0003, which, with losses, reduces each Signal output by the power splitter 250 by about 4 dBm to 2 dBm.

According to one important feature of the invention, the measuring system 230 is a phase-locked system in which the radio frequency generator and the detector or receiver portions are linked by matching phases of signals. This phase matching or locking enhances the linearity of the system 230 which enables the measuring system 230 to detect or sense very small changes in the signal reflected from or transmitted by the sample 232 to the antenna 244. In part, this phase locking feature is achieved by transmitting the reference signal to the phase shifter 252 which functions to selectively phase shift the reference signal; for example, a tuner liner stretcher such as a Part No. SR-05F available from Microlab/FXR, 10 Microlab Road, Livingston, N.J. 07039-1682 can be used for the phase shifter 252. The phase-shifted reference signal is then amplified by amplifier 254 (e.g., Part No. ZHL-2 from Mini-Circuits) to provide about 16 dB gain such that the phase-shifted reference signal has a power of 18 dBm. The phase-shifted reference signal is then inputted to the mixer 270, and in one embodiment, it is inputted into the "LO" port of the mixer 270. To achieve phase locking or matching during operation, the phase shifter 252 is tuned, automatically or manually, to phase match the reference signal and the sample signal, received at the mixer 270 from the sample branch circuit as discussed in detail below. Phase matching generally occurs when the output signal from the mixer 270 is maximized.

Referring again to FIG. 18, the sample signal enters the sample branch circuit of the measuring apparatus 230 from the power splitter 250 where the sample signal is amplified by amplifier 256. The amplifier 256 may provide a wide range of power amplifications, and in one preferred embodiment, the amplifier 256 is an amplifier that supplies 27 dB of gain, such as a Mini-Circuits, Part No. ZHL-2-8, to increase the power of the sample signal to about 29 dBm. The sample signal is then transmitted to a connection port of a directional coupler 258 (such as Mini-Circuits, Part No. ZFDC-10-2). In a preferred embodiment, the directional coupler 258 functions to reduce the sample signal to a known power value and to pass the sample signal to the tuning capacitor 260 as a traveling wave. For example, the sample signal power can be reduced by 10.75 dB with this power being dissipated as heat in the internal 50 ohm termination.

The reduced-power and known-power sample signal is then directed by the directional coupler 258 to the tuning capacitor 260 which is connected in parallel and in one embodiment is an air dielectric variable capacitor, such as that available from Johanson under Newark, Part No. 19F002, at 4725 Paris Street, Denver, Colo. 80239-2803, that varies from 1 to 30 picofarads. According to an important feature of the invention, the tuning capacitor 260 is used to impedance-match or radio-frequency couple the antenna 244 with the sample 232. The tuning capacitor 260 can be thought of as a lumped reactive element that is useful for impedance matching the antenna 244 and coupled sample 232 to 50 ohms or some other predetermined impedance based on the measuring apparatus 230 circuitry. In this regard, a number of factors affect the antenna input impedance, including, but not limited to, the material of the sample 232, the physical and electrical properties of the sample 232, the physical orientation of the sample 232, and the coupling distance, i.e., the distance between the antenna 244 and the sample 232. During operation, the tuning capacitor 260 is tuned or adjusted such that the input impedance of the antenna 244 when it is radio frequency coupled with the sample 232, the length of transmission line (i.e., the length, $L_C$, of lead or cable 262, shown in FIGS. 8–20) at a given operating frequency, and the parallel reactance of the adjusted tuning capacitor 260 all combine to create a predetermined impedance (e.g., 50 ohms in a preferred embodiment) as seen by the directional coupler 258.

The inventors appreciate that the minimum system 230 response time is improved by increasing the speed at which power can flow into the sample branch of the measuring system 230. The sample signal travels from the tuning capacitor 260 to the antenna 244 through the lead or cable 262. To control cable reactance and sample signal travel time in the cable 262, the length, $L_C$, of the cable 262 is maintained relatively short. For example, the cable 262 preferably is a coaxial cable (e.g., RG-402) with a length, $L_C$, less than 1 wavelength, and more preferably less than about ½ wavelength (which results in a loss of 2 percent at an operating frequence of about 1 GHz), and still more preferably less than about ¼ wavelength (which results in a loss of 1 percent at an operating frequency of about 1 GHz). In one embodiment, the length, $L_C$, of the coaxial cable 262 is about 2.5 inches. During operation of measuring system 230, the operating frequency of the signal generator 240 can be tuned or set so that the length, $L_C$, of the cable 262 appears as differing fractions of the wavelength of the sample signal. In one embodiment, the cable 262 is a 50-ohm impedance, coaxial cable with an outer conductor portion of copper with a 0.141-inch diameter and an inner conductor portion of silver-coated copper with a 0.043-inch diameter.

The cable 262 is connected to the antenna 244 which generally functions to transmit and receive radiated electromagnetic waves, i.e., radio waves. As with the cable 262, the antenna 244 is preferably configured to have less inductance to allow the power to flow more quickly through it and thereby, enhance the minimum response time of the measuring system 230 and allow the measuring system 230 to be used to measure short minority carrier lifetimes in semiconductor material samples 232. In this regard, a large number of low-reactance antenna designs and configurations may be utilized to practice the invention and to create an effective radio frequency coupling with the sample 232 with a short response time. For example, the antenna 244 may be an open-ended transmission line-type antenna (e.g., parallel two-wire, coaxial, parallel plate, stripline, and microstrip), a microstrip patch-type antenna (with a variety of patch shapes, such as square, rectangular, dipole, circular, elliptical, triangular, disc sector, circular ring, ring sector, and others) with any useful feed (such as microstrip line feed, probe feed, aperture-coupled feed, and proximity-coupled feed), a loop antenna, a coil antenna (as shown in FIG. 3), a dipole antenna, a monopole antenna, and a dielectric resonator antenna. Three illustrative examples of antenna configurations that are useful in the measuring system 230 are described below with reference to FIGS. 19–24.

Figure 19:
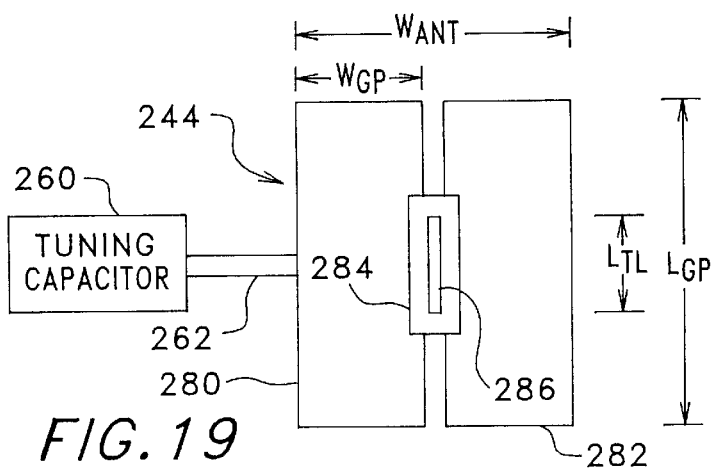
FIGS. 19 and 20 are top and side views, respectively, of a preferred antenna for use with the measuring apparatus of FIG. 18.
Figure 20:
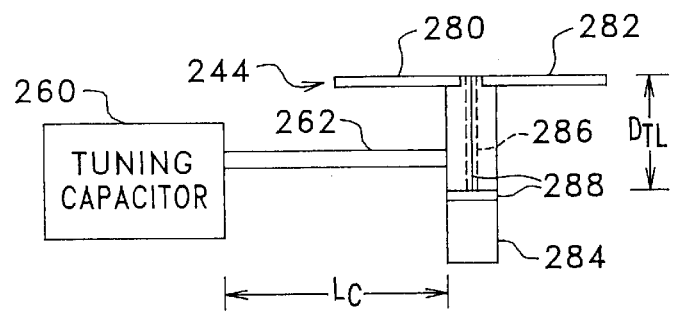

FIGS. 19 and 20 illustrate a preferred embodiment of the antenna 244 that includes features and components that provide it with characteristics of a rectangular microstrip or patch antenna as well as an aperture antenna. As illustrated, the microstrip/aperture hybrid antenna 244 is connected to the tuning capacitor 260 via the cable 262 to allow it to receive the sample signal from the signal generator 240 and to transmit any sample-coupled-photoconductivity signals received from the sample 232 during coupling and sampling measurements. The cable 262 is electrically or operatively connected to the transmission line 286 which, as illustrated, is a wave guide configured as an open-ended strip line transmission line with a length, $L_{TL}$, that may be selected from a large range of lengths but in one preferred embodiment is about 1 inch and with a depth, $D_{TL}$, that also may be selected from a large range of depths but in one preferred embodiment is about 0.9 inches. Although shown as rectangular in shape, numerous other "patch" shapes can be utilized, as discussed above. The transmission line 286 is held in place within the antenna 244 and electrically isolated by the dielectric positioning block 284, which may be fabricated from any number of electrically insulating materials, such as Teflon or other plastic materials.

The effective operation of the antenna 244 is furthered by the use of a ground plane flange comprising a left and a right ground plane 280 and 282, respectively. As illustrated, the ground planes 280, 282 are rectangular pieces of thin metal sheet, such as 0.01-inch thick sheet brass with a width, $W_{GP}$, of about 1 inch and a length, $L_{GP}$, of about 2.75 inches. The ground planes 280, 282 are interconnected with each other and ground via the ground plane connector 288. Clearly, the invention could be practiced with a variety of other ground plane flange configurations and materials which would affect the operation of the antenna 244 but could be adjusted for during the tuning operations for the tuning capacitor 260, by selection of the cable 262 length, $L_C$, and by selection of the operating frequency at the signal generator 240.

Figure 21:
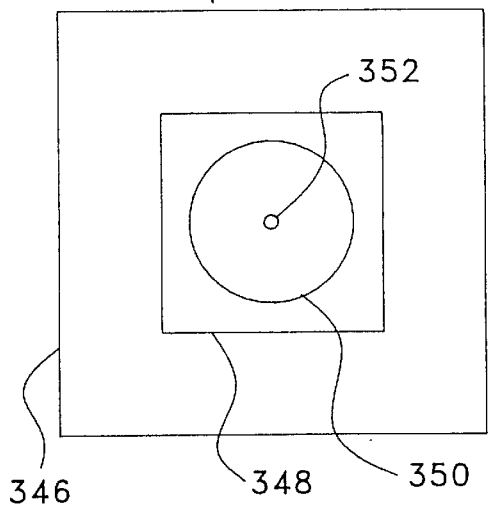
FIGS. 21 and 22 are top and side views, respectively, of an alternative antenna for use with the measuring apparatus of FIG. 18.
Figure 22:
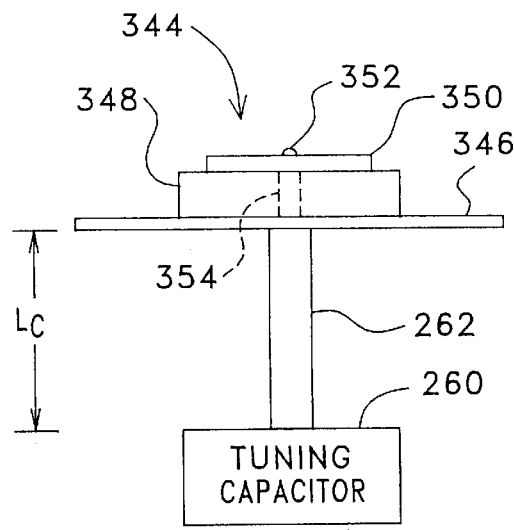

As discussed above, a number of other configurations for an antenna can be utilized with the measuring system 232 to obtain radio-frequency coupling with the sample 232 while effectively shortening system response times by limiting antenna reactance values. For example, an alternate antenna 344 that is a microstrip patch-type antenna is shown in FIGS. 21 and 22. The patch 350 is illustrated as circular and may be fabricated from any typical metal. For example, the patch 350 may be formed with a 1-inch diameter from a 0.01-inch thick sheet of brass or other suitable metal. The patch 350 is electrically connected to the cable 262, and therefore, the tuning capacitor 260, with a microstrip line 354. A dielectric substrate 348 is included to isolate and structurally support the patch 350, and as with the antenna 244, the substrate 348 may be fabricated from numerous electrically-insulating materials, such as Teflon, and may have a number of thicknesses, such as ⅛ inch. The patch 350 is attached to the substrate 348 with a connector 352. A ground plane 346 is positioned on the opposing side of the substrate 348, and in one embodiment, this ground plate 346 is also fabricated from 0.01-inch brass sheet. In the embodiment in which the patch 350 has a 1-inch diameter, the ground plane 346 has 2-inch long sides.

Figure 23:
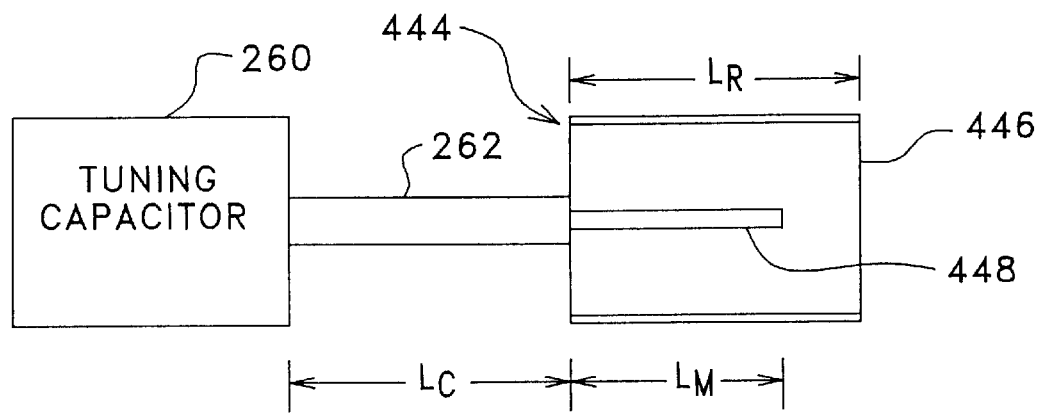
FIGS. 23 and 24 are top and end views, respectively, of another alternative antenna for use with the measuring apparatus of FIG. 18.
Figure 24:
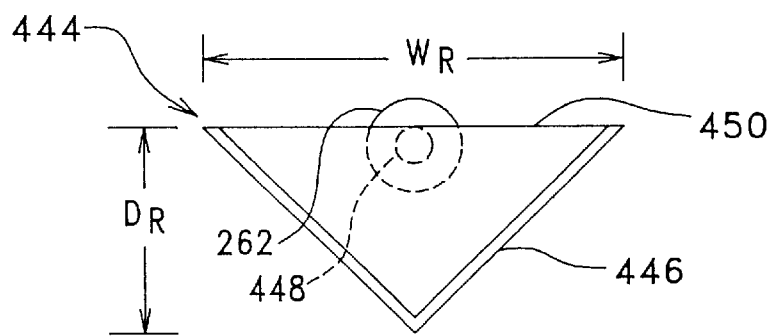

An additional alternate antenna configuration is provided in FIGS. 23 and 24. The antenna 444 can be generally described as a monopole transmission antenna with a corner reflector. The monopole 448 is operatively connected to the tuning capacitor 260 with the cable 262. In an illustrative example, the monopole 448 has a length, $L_M$, of about 0.5 inches and extends along the top of the antenna 444 in a dielectric positioner 450 (e.g., epoxy or the like). The reflector 446 has a length, $L_R$, of about 0.75 inches, a depth, $D_R$, of about 0.4 inches, and a width, $W_R$, of about 0.5 inches. Again, the reflector 446 may be fabricated from any number of metals, and in one embodiment is fabricated from 0.01-inch sheet brass which provides desired reflective properties. Although only three specific examples of antenna 244, 344, 444 are provided for use with the measuring system 230, the invention could be practiced with numerous other embodiments of antennas, and these examples are provided to illustrate the general concepts of radio-frequency coupling with low antenna reactance to provide improved measuring system 230 response but not as a limitation of the invention. Although not shown, each of the antenna embodiments 244, 344, 444 preferably is positioned within an isolation device or apparatus, such as box 77 shown in FIGS. 2 and 3, to isolate the antennas 244, 344, and 444 from interference during operations, e.g., detecting stray signals, adjacent movements of objects, and other potentially interfering signals.

Referring again to FIG. 18, the antenna 244 is positioned a variable or adjustable sampling or coupling distance from the sample 232 by a positioner 96 or other device (not shown) which typically moves the sample 232 (although the antenna 244 could also be moved relative to the sample 232)

to obtain a radio-frequency coupling when the antenna 244 transmits the sample signal to the sample 232 and the sample 232 generates a sample-coupled-photoconductivity signal which the antenna 244 receives. As discussed above, the sample 232 is a piece of semiconductor material that, significantly, may have either direct or indirect bandgaps, may have bandgaps of any size including less than 1.1 eV, and may have very short minority carrier lifetimes, i.e., between 2 and 40 nanoseconds. A laser 234 is positioned to illuminate the semiconductor sample 232 with a pulse of light 236 to, as discussed above, generate excess electrons and holes resulting in a change in the photoconductance of the sample 232 and the electromagnetic radiation or radio waves radiated from the sample 232 to the antenna 244. In a preferred embodiment, the laser 234 is a pulse laser which provides repetitive signals that enhance data acquisition during sampling operations and allow for sufficient averaging to reduce possible noise problems. The laser 234 preferably is operable to vary and to optimize the wavelength and power levels of the pulse of light 236 for different samples 232 to allow a fuller breadth of information to be collected for each sampling operation. Of course, other external energy sources, besides a laser or light source, well known in the art could be used to initially alter the electrical characteristics of the sample 232, and these other means of deviating the equilibrium of the electron and hole concentrations of the sample 232 are considered within the breadth of the invention.

During operations, the sample 232 is positioned a sampling or coupling distance from the antenna 244 and the measuring apparatus 230 is tuned. In one embodiment, when a load of 50 ohms is established in the portion of the sample branch circuit including the tuning capacitor 260, the cable 262, the antenna 244, and the sample 232, the reflection coefficient $\Gamma$, is zero and no or little power is reflected or returned to the directional coupler 258. In the preferred embodiment discussed above, the sample signal transmitted from directional coupler 258 has a power level of about 18 dBm and after tuning of the measuring apparatus 230, no or little power is returned to the directional coupler 258 (i.e., the sample-coupled-photoconductivity signal received by the antenna 244 from the sample 232 is very low power, or nonexistent) and the measured reflection coefficient, $\Gamma$, may be 0.0007 or less.

Then when sampling is commenced, the light 236 from the laser 234 is absorbed by the sample 232 and the electrical properties of the sample 232 are displaced from equilibrium. Most notably, carriers are excited to conduction and valence bands to increase the photoconductivity. This change in the sample 232 conductivity couples with the antenna 244 to change the antenna's input impedance, and the load or impedance in the sample branch circuit including the tuning capacitor 260, the cable 262, the antenna 244, and the sample 232 is no longer 50 ohms as initially tuned. Additionally, the reflection coefficient is no longer zero in this portion of the sample branch circuit, and as an illustration, may be r equal to 0.0356 which represents a 50-fold increase in the reflected power from the sample 232.

This reflected power or sample-coupled-photoconductivity signal is transmitted back to the directional coupler 258 through the antenna 244, cable 262, and the tuning capacitor 260. The sample-coupled-photoconductivity signal then exits the directional coupler 258 through the out port, and in one operational example where the sample signal power from the directional coupler 258 is 18 dBm, the sample-coupled-photoconductivity signal exiting the directional coupler 258 may be −11 dBm with each light pulse 236 absorbed from the laser 234 by the sample 232. The sample-coupled-photoconductivity signal is then passed to the power splitter 264 (e.g., a Mini-Circuits, Part No. ZFSC-2-2) which reduces the power level by a predetermined amount such as 4 dBm, and is connected to the power meter 266 (for example, an oscilloscope device) which is used during sample tuning to minimize the reflected power out of the directional coupler 258. This minimization of reflected power during tuning corresponds to tuning the portion of the sample branch circuit including the tuning capacitor 260, the cable 262, the antenna 244, and the sample 232 to 50 ohms of load or impedance when the laser 234 is off or not transmitting pulses 236, which effectively nulls the dark conductivity.

The sample-coupled-photoconductivity signal is transmitted to the amplifier 268 which provides gain to the received signal. For example, the amplifier 268 may be an amplifier, such as a Hewlett Packard, Part No. 84470, that provides 26 dB gain and has a frequency operation range of 0.1 to 1300 MHz such that the sample-coupled-photoconductivity signal is increased in power to +11 dBm prior to transmittal to the mixer 270.

The mixer 270 (e.g., a level 23 mixer available from Mini-Circuits as Part No. ZMY-2) receives the sample-coupled-photoconductivity signal from the amplifier 268 in the RF port of the mixer 270 and receives the reference signal from the amplifier 254 in the LO port of the mixer 270. The sample-coupled-photoconductivity signal is at the operating frequency of the signal generator 240 but also includes other frequencies that make up the decaying pulse of photoconductivity for each of the laser pulses 236 from the laser 234 that are absorbed by the sample 232. As discussed above, the phase shifter 252 is adjusted to maximize the output signal of the mixer 270 which typically occurs when the reference signal and the sample-coupled-photoconductivity signal are phase matched. The output of the mixer 270 is transmitted from the IF port of the mixer 270, thereby creating sum and difference frequencies with a maximum conversion loss of about 10 dB. The output signal is the dc signal (difference frequency) outputted from the mixer 270 and also contains the frequencies necessary to reconstruct or create a representation of the sample photoconductive decay pulse. In the above discussed embodiment or example, the power level of the output signal is at about 1 dBm.

During sample operations, the output signal from the mixer 270 is then transmitted to another amplifier 272 included in the measuring apparatus 230 for increasing its power level. In one preferred embodiment, the amplifier 272 has about a 20-dB gain to bring the power of the output signal in the above exemplary embodiment to about 21 dBm. For these purposes, the amplifier 272 may be a dc amplifier with a 600-MHz bandwidth, such as a dc amplifier available from AVTECH Electrosystems, Box 265, Ogdensburg, N.Y. 13669-0265, as Part No. AV-141C-PS. The output signal (i.e., the photoconductive decay output signal) is then transmitted to the digital storage oscilloscope or other display device 274 which functions to display the output signal and to record the output signal on a digital storage oscilloscope. Preferably, the oscilloscope has a bandwidth sufficiently large to create and resolve photoconductivity decay curves from the output signal. For example, an oscilloscope available from Tektronix, Inc., P.O. Box 500, M/S 78-654, Howard Vollum Industrial Park, Beaverton, Oreg. 97077, as Part No. TDS. 430A is useful for most semiconductor samples 232, but for very short lifetime samples 232, a bandwidth larger than the 400 MHz of the Tektronix TDS 430A oscilloscope may be more desirable or even required for proper curve resolution.

During testing of the invention, the measuring system 230 with the antenna 244 configuration illustrated in FIGS. 19 and 20 provided a greatly improved system response time, i.e., about equal to that of the width of the laser pulse 236 or 2 nanoseconds. As tested, the measuring system 230 was operated with an operating frequency of about 900 MHz. It is believed that this high operating frequency (which enhances the coupling efficiency between the antenna 244 and the "antenna"-like excited sample 232) in combination with the lowered impedance in the sample branch circuit (especially, in the cable 262 which is shortened and in the antenna 244) provided a significant improvement in time resolution and efficiency over the measuring system 30 with the coil antenna 44 of FIG. 1. Additionally, the phase-locked feature controls or eliminates random noise that may interfere with sensitivity of the measuring system 230.

Figure 25:
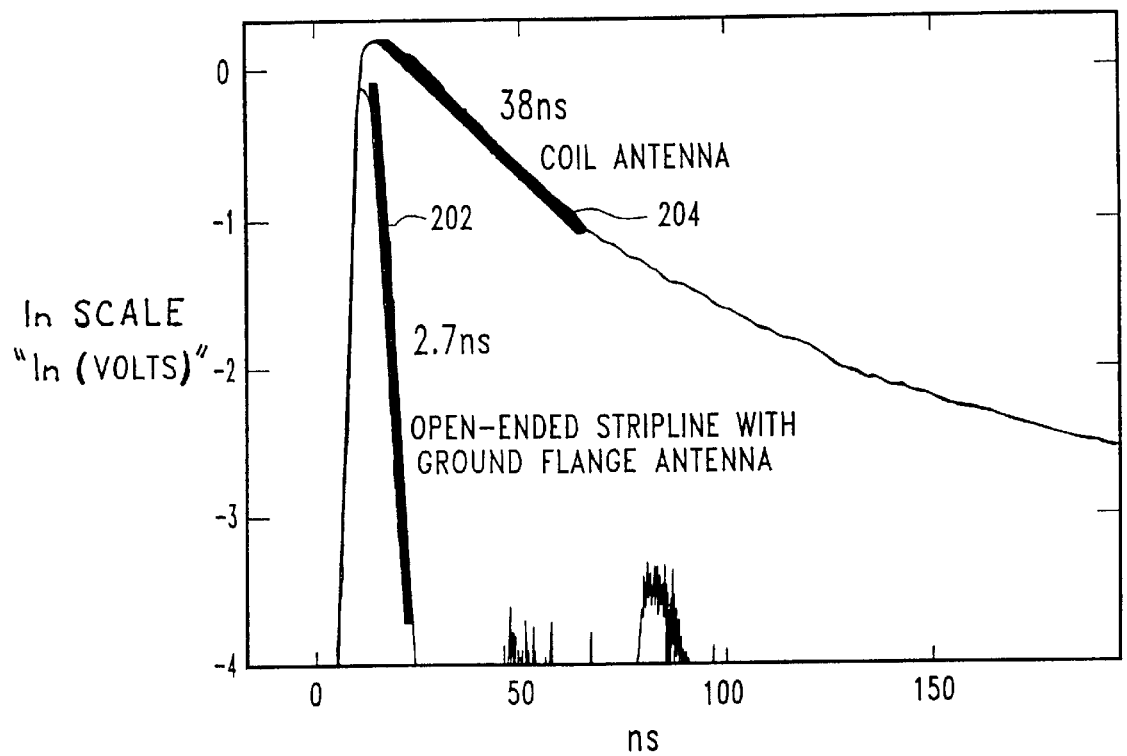
FIG. 25 and 26 are graphs illustrating the ability of the measuring apparatus of FIG. 18 to measure short minority carrier lifetimes.

Turning to FIG. 25, curve 202 represents the resolution of the output signal of the mixer 270 on the oscilloscope 274 for the antenna 244 shown in FIGS. 19 and 20 while curve 204 represents a similar representation for the coil antenna 44 of measuring apparatus 30. Both systems 230 and 30 were used to measure the minority carrier lifetimes in a semiconductor sample 232, 32 comprising Fe-doped InP material which has a very short minority carrier lifetime, $\tau$, less than about 0.1 nanoseconds. The system response of the measuring apparatus 230 was found to be about 2.7 nanoseconds or about 14 times faster than the measuring apparatus 30 with the coiled antenna 44.

Figure 26:
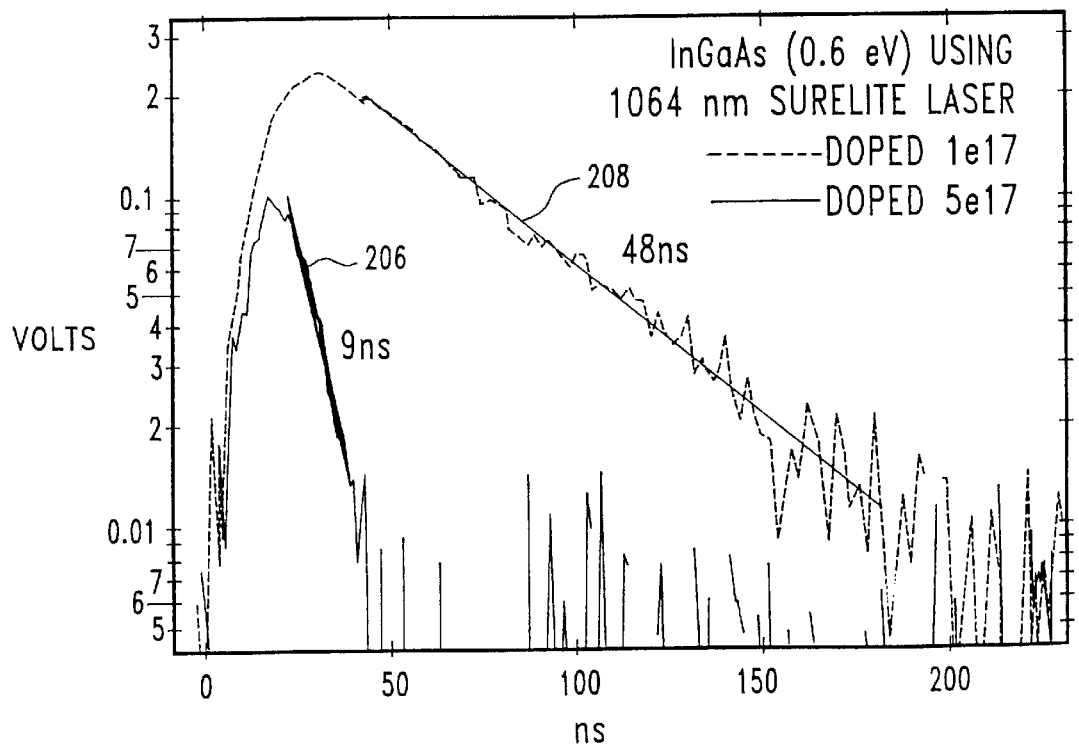

FIG. 26 illustrates the improved time resolution and range of uses of the measuring apparatus 230 with the antenna 244 for measuring minority carrier lifetimes in a sample 232.

FIG. 26 shows the results of the use of the measuring apparatus 230 to resolve a decay curve 208 for a sample 232 of InGas with a bandgap of legs than 1.1 eV (i.e., 0.6 eV) doped at 1e17 which could not be resolved by many prior art devices because of the small bandgap. FIG. 26 also illustrates the use of the measuring apparatus 230 to resolve a decay curve 206 for a sample 232, i.e., InGaAs (0.6 eV) doped at 5e17, with a very short minority carrier lifetime, i.e., about 9 nanoseconds, that prior to the invention was not directly measurable. As these graphs illustrate, the measuring system 230 provides significant response time improvements over the prior art and over measuring apparatus 30 and also provides beneficial diversity for use with small bandgap semiconductor materials over a range of minority carrier lifetime lengths.

The foregoing description is considered as illustrative only of the principles of the invention. Furthermore, since numerous modifications and changes will readily occur to those skilled in the art, it is not desired to limit the invention to the exact construction and processes shown and described above. Accordingly, all suitable modifications and equivalents may be resorted to falling within the scope of the invention as defined by the claims which follow.

For example, while the apparatus 30 uses a bridge circuit, other electrical configurations or circuits could also be used to negate or tune out the dark conductivity of a sample being tested or to otherwise negate or remove the effects of conduction within the sample prior to illumination of the sample with a laser beam or other light sources. As another example, while in the discussion above, mutual inductance and/or coupled impedance between a sample and the coil is primarily adjusted by changing the distance or spatial relationship between the sample and the coil, instead of varying the spacing between the sample and the coil, the mutual inductance and/or coupled impedance could be varied by inserting a spacer, slide, or other material or object between the sample and the coil to affect or adjust the magnetic coupling between the sample and the coil.

The words "comprise," "comprises," "comprising," "include," "including," and "includes" when used in this specification and in the following claims are intended to specify the presence of stated features, elements, integers, components, or steps, but they do not preclude the presence or addition of one or more other features, elements, integers, components, steps, or groups thereof The embodiments of the invention in which an exclusive property or privilege is claimed are defined as follows:

1. An apparatus for measuring minority carrier lifetime in a semiconductor material sample using radio-frequency coupling, comprising:
   a signal generator adapted for transmitting an initiating signal at an operating frequency;
   a radio frequency antenna operatively connected to the signal generator for generating electromagnetic radiation in response to the initiating signal toward the semiconductor material sample to radio-frequency couple the radio frequency antenna to the semiconductor material sample with radio frequency energy across a coupling distance between the radio frequency antenna and the semiconductor material sample, wherein the radio frequency antenna is adapted for receiving a sample-coupled-photoconductivity signal from the semiconductor material sample;
   a tuning means operatively connected to the signal generator and the radio frequency antenna and configured to adjust an impedance of the radio frequency antenna to radio-frequency couple the radio frequency antenna and the semiconductor material sample; and
   a minority carrier lifetime determination means operatively connected to the radio frequency antenna for processing the sample-coupled-photoconductivity signal to determine the minority carrier lifetime of the semiconductor material sample.

2. The apparatus of claim 1, wherein the operating frequency is greater than about 400 MHz.

3. The apparatus of claim 2, wherein the operating frequency is selected from the range of about 900 MHz to about 2000 MHz.

4. The apparatus of claim 1, further including a splitter operatively connected to the signal generator for receiving the initiating signal and in response, transmitting a reference signal into a phase shifter in a reference branch circuit and a sample signal into a sample branch circuit including the radio frequency antenna and further including a mixer operatively connected to the reference branch circuit and the sample branch circuit for receiving the reference signal and the sample-coupled-photoconductivity signal and for transmitting an output signal to the minority carrier lifetime determination means, the output signal being created by the mixer based on operating the phase shifter to phase match the reference signal and the sample-coupled-photoconductivity signal.

5. The apparatus of claim 1, wherein the radio frequency antenna comprises an open-ended stripline transmission line, a positioning block comprising dielectric material for at least partially enclosing and for positioning the transmission line, and an electrically conductive, planar ground flange adjacent the transmission line.

6. The apparatus of claim 1, wherein the radio frequency antenna is selected from the group of antennas consisting of open-ended transmission line antenna, microstrip patch antenna, loop antenna, coil antenna, dipole antenna, monopole antenna, and dielectric resonator antenna.

7. The apparatus of claim 1, wherein the tuning means comprises a tuning capacitor interposed between and connected to the signal generator and the radio frequency antenna, wherein the tuning capacitor is operable to impedance match the radio frequency antenna and the semiconductor material sample to radio-frequency couple the radio frequency antenna and the semiconductor material sample.

8. The apparatus of claim 7, further including a transmission line between the tuning capacitor and the radio frequency antenna for carrying a sample signal portion of the initiating signal to the radio frequency antenna from the tuning capacitor, wherein the transmission line has a length of less than about 1 wavelength of the sample signal portion.

9. The apparatus of claim 8, wherein the length of the transmission line is less than about ¼ of the wavelength of the sample signal portion.

10. A radio-frequency coupling method of measuring minority carrier lifetimes of a semiconductor material sample, comprising:

providing a measuring apparatus including a radio frequency antenna;

positioning the semiconductor material sample a coupling distance from the radio frequency antenna;

operating the radio frequency antenna to generate an electromagnetic radiation at an operating frequency toward the semiconductor material sample to radio-frequency couple the radio frequency antenna to the semiconductor material sample with radio frequency energy across the coupling distance;

adjusting an impedance of the radio frequency antenna to radio-frequency couple the radio frequency antenna and the semiconductor material sample;

applying energy with an energy source to the semiconductor material sample to excite carriers in the semiconductor material sample;

receiving with the radio frequency antenna a sample-coupled-photoconductivity signal from the semiconductor maternal sample responsive to the applied energy; and processing the sample-coupled-photoconductivity signal to determine a minority carrier lifetime for the semiconductor material sample.

11. The method of claim 10, wherein the operating frequency is greater than about 400 MHz.

12. The method of claim 11, wherein the operating frequency is between about 900 MHz and 2000 MHz.

13. The method of claim 10, wherein the measuring apparatus includes a signal generator, further including prior to the operating of the radio frequency antenna, transmitting an initiating signal to the radio frequency antenna with the signal generator at the operating frequency.

14. The method of claim 13, further including splitting the initiating signal into a reference signal and a sample signal and transmitting the reference signal to a phase shifter in a reference branch circuit and the sample signal to the radio frequency antenna in a sample branch circuit.

15. The method of claim 14, wherein the processing of the sample-coupled-photoconductivity signal includes using the phase shifter to phase match the reference signal and the sample-coupled-photoconductivity signal, outputting an output signal based on the using of the phase shifter, and determining the minority carrier lifetime for the semiconductor material sample based on the output signal.

16. The method of claim 10, wherein the measuring apparatus includes a tuning capacitor operatively connected with a transmission line to the radio frequency antenna, and wherein the step of adjusting the impedance of the radio frequency antenna further comprises matching the impedance of the antenna and the semiconductor material sample to a predetermined impedance with the tuning capacitor whereby the radio frequency antenna and the semiconductor material sample become radio-frequency coupled.

17. The method of claim 16, wherein the transmission line is coaxial cable with a length of less than about ¼ wavelength of the sample signal.

18. The method of claim 10, wherein the radio frequency antenna is selected from the group of antennas consisting of open-ended transmission line antenna, microstrip patch antenna, loop antenna, coil antenna, dipole antenna, monopole antenna, and dielectric resonator antenna.

19. The method of claim 10, wherein the energy source comprises a laser.

* * * * *